US006929712B2

(12) United States Patent
Hanazaki et al.

(10) Patent No.: US 6,929,712 B2
(45) Date of Patent: Aug. 16, 2005

(54) PLASMA PROCESSING APPARATUS CAPABLE OF EVALUATING PROCESS PERFORMANCE

(75) Inventors: Minoru Hanazaki, Hyogo (JP); Keiichi Sugahara, Hyogo (JP); Toshihiko Noguchi, Hyogo (JP); Toshio Komemura, Hyogo (JP); Masakazu Taki, Hyogo (JP); Mutumi Tuda, Hyogo (JP); Kenji Shintani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 209 days.

(21) Appl. No.: 10/235,783

(22) Filed: Sep. 6, 2002

(65) Prior Publication Data

US 2003/0178140 A1 Sep. 25, 2003

(30) Foreign Application Priority Data

Mar. 25, 2002  (JP) .................................... 2002-083681

(51) Int. Cl.$^7$ ...................... H01L 21/00; C23C 16/00
(52) U.S. Cl. ........................ 156/345.28; 156/345.24; 156/345.25; 156/345.43; 156/345.47; 118/712; 118/723 E; 118/723 ER; 118/728; 315/111.01; 315/111.31; 315/111.61; 315/111.21; 204/298.39
(58) Field of Search ....................... 156/345.28, 345.24, 156/345.25, 345.43, 345.47; 118/712, 723 E, 723 ER, 728; 315/111.01, 111.31, 111.61, 111.21; 204/298.39

(56) References Cited

U.S. PATENT DOCUMENTS 5,273,610 A * 12/1993 Thomas et al. ......... 156/345.28
5,565,737 A    10/1996 Keane
6,184,687 B1 *  2/2001 Yamage et al. ............. 324/464
6,291,999 B1    9/2001 Nishimori et al.
6,447,691 B1 *  9/2002 Denda et al. .................. 216/61
6,685,797 B2 *  2/2004 Matsumoto et al. ... 156/345.24

FOREIGN PATENT DOCUMENTS

| JP | 11-121440   | 4/1999 |
| JP | 2000-269195 | 9/2000 |
| JP | 2002-100622 | 4/2002 |
| JP | 2002-110661 | 4/2002 |

* cited by examiner

Primary Examiner—P. Hassanzadel
Assistant Examiner—Ram N Kackar
(74) Attorney, Agent, or Firm—McDermott Will & Emery LLP

(57) ABSTRACT

A high-frequency current detector of a plasma processing apparatus detects a high-frequency current produced when high-frequency power in the range that does not cause generation of plasma in a chamber is supplied from a high-frequency power supply source to the chamber. The high-frequency current detector outputs the detected high-frequency current to a computer. The computer compares the high-frequency current received from the high-frequency current detector with a reference high-frequency current. When the received high-frequency current matches the reference high-frequency current, the computer determines that the process performance is normal. Otherwise, the computer determines that the process performance is abnormal. In this way, high-frequency characteristics specific to the apparatus are detected and the process performance are evaluated based on the detected high-frequency characteristics.

7 Claims, 27 Drawing Sheets

PLASMA PROCESSING APPARATUS CAPABLE OF EVALUATING PROCESS PERFORMANCE

BACKGROUND OF THE INVENTION

1. Field of the Invention

The present invention generally relates to a plasma processing apparatus. More particularly, the present invention relates to a plasma processing apparatus capable of detecting high-frequency characteristics specific to the apparatus and evaluating process performance based on the detected high-frequency characteristics.

2. Description of the Background Art

There are many processes using plasma such as etching, thin film formation and sputtering in a manufacturing process of a semiconductor device, a liquid crystal display (LCD) and the like.

In these processes, high-frequency power is externally applied to a processing chamber for conducting the processes, whereby plasma is generated therein. In order to efficiently supply the high-frequency power for generating plasma from a high-frequency power supply source to the processing chamber, an impedance matching circuit is provided between the high-frequency power supply source and the processing chamber. The impedance matching circuit is formed by a variable inductance element, a variable capacitance element and the like.

In a plasma processing apparatus for conducting various processes by using plasma, it is important to maintain constant process performance in order to produce products with high yield. Mass production of the products is realized with a plurality of plasma processing apparatuses. It is therefore necessary to prevent the process performance from varying between the plasma processing apparatuses.

However, it is difficult to detect a change in process performance with time and variation of process performance between the plasma processing apparatuses. Therefore, the constant process performance is conventionally maintained by conducting maintenance of the plasma processing apparatus when defective products are produced by that apparatus. Alternatively, constant process performance is maintained by empirically predicting the period during which the process performance will not change and periodically conducting maintenance of the plasma processing apparatuses based on the predicted period.

Japanese Patent Laying-Open No. 11-121440 discloses a method for evaluating a plasma processing apparatus and a process by detecting an electric change of a high-frequency power feeding system for feeding high-frequency power to a processing chamber.

Referring to FIG. 29, a plasma processing apparatus 300 includes a chamber 250, a discharging electrode 251, a table 253, a monitor 254, a matching circuit 255, a high-frequency power supply source 256, and a computer 257.

Discharging electrode 251 is provided on table 253. Monitor 254 is connected to discharging electrode 251, and measures the impedance of plasma Q as an electric physical quantity upon generation of plasma Q.

Matching circuit 255 is connected between monitor 254 and high-frequency power supply source 256, and conducts impedance matching in order to efficiently supply high-frequency power from high-frequency power supply source 256 to chamber 250.

High-frequency power supply source 256 is connected between matching circuit 255 and a ground node GND, and generates high-frequency power. Computer 257 is connected to monitor 254, and evaluates the plasma processing apparatus and process performance based on the impedance measured by monitor 254.

With a semiconductor wafer 252 placed on discharging electrode 251, high-frequency power supply source 256 outputs high-frequency power, and matching circuit 255 conducts impedance matching in order to efficiently supply the high-frequency power from high-frequency power supply source 256 to chamber 250. The high-frequency power is supplied to discharging electrode 251 through monitor 254, whereby plasma Q is generated in chamber 250. In this case, chamber 250 contains a reactive gas for etching, thin film formation or the like. Therefore, semiconductor wafer 252 is etched with the generated plasma Q.

After plasma Q is generated, monitor 254 measures the impedance of plasma Q, and outputs the measured impedance to computer 257. Computer 257 evaluates plasma processing apparatus 300 and process performance thereof based on the measured impedance received from monitor 254.

Japanese Patent Laying-Open No. 2000-269195 discloses a method for detecting both a change in plasma processing characteristics of a semiconductor wafer with time and the timing of cleaning the inside of a vacuum container. In this method, the change in plasma processing characteristics with time and the cleaning timing are detected by measuring the impedance of plasma in a plasma processing apparatus, a peak-to-peak voltage of a high-frequency voltage, and a self-bias voltage generated at an electrode receiving the high-frequency voltage.

However, the methods disclosed in the above Japanese Patent Laying-Open Nos. 11-121440 and 2000-269195 measure impedance of plasma generated in the plasma processing apparatus, impedance specific to the apparatus which is determined by the geometry of the plasma processing apparatus, and the overall impedance including impedance of a high-frequency power feeding portion i.e., a portion from the impedance monitor for monitoring the impedance of plasma to the plasma processing apparatus.

FIG. 30 shows an equivalent circuit upon generation of plasma. Referring to FIG. 30, a circuit 210 is an equivalent circuit of a matching box, a circuit 220 is an equivalent circuit of a coaxial cable from circuit 210 to the processing chamber, a circuit 230 is an equivalent circuit within a processing chamber, and a circuit 240 is an equivalent circuit of a grounding system.

Circuit 210 has impedance $Z_M$. Circuit 220 has impedance $Z_C$. Circuit 230 has impedance $Z_Q$. Circuit 240 has impedance $Z_E$. A high-frequency power supply source 200 is connected between ground node GND and circuit 210, and outputs high-frequency power.

The high-frequency power from high-frequency power supply source 200 is supplied to circuit 230 as a processing chamber through circuits 210, 220. A return current flows toward ground node GND of high-frequency power supply source 200 through circuit 240 as a grounding system.

Accordingly, the impedance upon generation of plasma includes impedance to the processing chamber which is determined by impedances $Z_M$, $Z_C$, impedance of plasma which is determined by impedances $Z_Q$, $Z_E$, and impedance specific to the apparatus.

Accordingly, the conventional methods cannot extract only the impedance specific to the apparatus.

SUMMARY OF THE INVENTION

It is an object of the present invention to provide a plasma processing apparatus for detecting high-frequency characteristics specific to the apparatus and evaluating process performance based on the detected high-frequency characteristics.

According to the present invention, a plasma processing apparatus includes a chamber for generating plasma, a high-frequency power supply source supplying high-frequency power to the chamber, and an characteristics evaluating circuit detecting high-frequency characteristics in the chamber by using the high-frequency power in a range lower than that generating the plasma and evaluating process performance in the chamber based on the detected high-frequency characteristics.

The high-frequency characteristics are detected by supplying the high-frequency power in the range lower than that generating the plasma in the chamber. The process performance is evaluated based on the detected high-frequency characteristics. Accordingly, the present invention enables detection of the high-frequency characteristics specific to the plasma processing apparatus. Moreover, the present invention enables accurate evaluation of the process performance based on the high-frequency characteristics specific to the plasma processing apparatus.

Preferably, the characteristics evaluating circuit compares the detected high-frequency characteristics with standard high-frequency characteristics corresponding to normal process performance, and determines whether the process performance is normal or not based on the comparison result.

The process performance is evaluated by comparing the detected high-frequency characteristics with the standard high-frequency characteristics. Accordingly, the present invention facilitates determination of whether the process performance is normal or not.

Preferably, the plasma processing apparatus further includes another high-frequency power supply source supplying to the chamber the high-frequency power in the range lower than that generating the plasma, a first switch starting and stopping supply of the high-frequency power from the high-frequency power supply source to the chamber, and a second switch starting and stopping supply of the high-frequency power from another high-frequency power supply source to the chamber. The first switch is turned OFF and the second switch is turned ON when the process performance is evaluated.

The high-frequency characteristics specific to the plasma processing apparatus are detected by supplying the high-frequency power in the range that does not cause generation of plasma to the chamber by using a special high-frequency power supply source. Accordingly, the present invention enables the high-frequency characteristics specific to the apparatus to be detected accurately without providing a special detector for detecting generation of plasma.

More preferably, the characteristics evaluating circuit detects a reflection coefficient of a high-frequency voltage from another high-frequency power supply source and evaluates the process performance based on the detected reflection coefficient. The reflection coefficient is a ratio of a reflected wave from the chamber to an incident wave on the chamber.

Regarding the high-frequency voltage, an incident wave on the chamber and a reflected wave from the chamber are detected, and the ratio of the reflected wave to the incident wave is calculated. The process performance is evaluated based on the calculated reflection coefficient. Accordingly, the present invention enables the process performance to be evaluated based on the high-frequency characteristics specific to the plasma processing apparatus caused by the chamber.

More preferably, another high-frequency power supply source generates high-frequency power having a frequency varied in a prescribed range, and the characteristics evaluating circuit detects high-frequency characteristics obtained with the frequency of the high-frequency power being varied and evaluates the process performance based on the detected high-frequency characteristics.

The high-frequency characteristics are detected with the frequency of the high-frequency power being varied. The process performance is evaluated based on the detected high-frequency characteristics. Accordingly, the present invention enables detection of a change in process performance caused by aging of each part of the plasma processing apparatus or the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
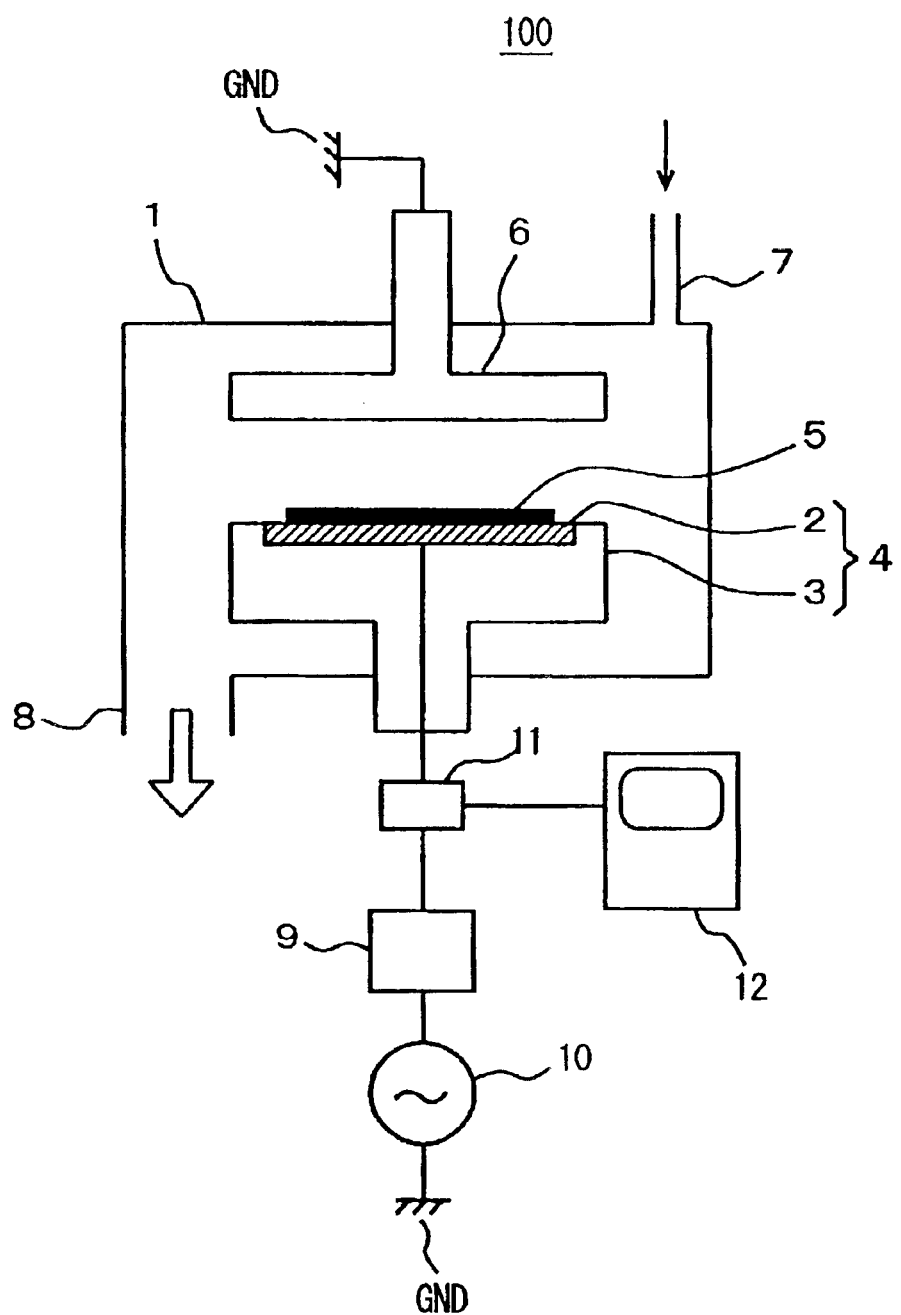
FIG. 1 is a schematic block diagram of a plasma processing apparatus according to a first embodiment of the present invention.

Hereinafter, embodiments of the present invention will be described in detail with reference to the accompanying drawings. Note that the same or corresponding portions are denoted with the same reference numerals and characters throughout the figures, and description thereof will not be repeated.

[First Embodiment]

Referring to FIG. 1, a plasma processing apparatus 100 according to the first embodiment of the present invention includes a chamber 1, a stage 4, an upper electrode 6, a gas line 7, an exhaust port 8, a high-frequency matching box 9, a high-frequency power supply source 10, a high-frequency current detector 11, and a computer 12.

Stage 4 is formed of a lower electrode 2 and an insulator 3. Lower electrode 2 is surrounded by insulator 3 except for the main surface thereof. Lower electrode 2 receives high-frequency power from high-frequency power supply source 10. Insulator 3 electrically insulates lower electrode 2.

Upper electrode 6 faces stage 4. Gas line 7 introduces a reactive gas into chamber 1. Exhaust port 8 serves to exhaust the reactive gas within chamber 1 to the outside with a vacuum pump (not shown).

High-frequency power supply source 10 has its one end connected to a ground node GND, and the other end connected to high-frequency matching box 9. High-frequency power supply source 10 outputs high-frequency power of 13.56 MHz.

High-frequency matching box 9 is connected between high-frequency power supply source 10 and high-frequency current detector 11. High-frequency matching box 9 conducts impedance matching in order to efficiently supply the high-frequency power from high-frequency power supply source 10 to lower electrode 2 in chamber 1.

High-frequency current detector 11 is provided between lower electrode 2 and high-frequency matching box 9. High-frequency current detector 11 detects a high-frequency current flowing through a high-frequency power feed path between high-frequency power supply source 10 and lower electrode 2, and outputs the detected high-frequency current to computer 12.

Based on the high-frequency current received from high-frequency current detector 11 and the high-frequency power from high-frequency power supply source 10, computer 12 evaluates process performance by the method described later.

In plasma processing apparatus 100, a reactive gas is introduced into chamber 1 through gas line 7 and exhausted through exhaust port 8 so that the pressure in chamber 1 is kept at about 10 Pa to about 200 Pa. The high-frequency power is supplied to lower electrode 2, and plasma is generated between lower electrode 2 and upper electrode 6. A semiconductor wafer 5 placed on lower electrode 2 is thus processed with the generated plasma. In plasma processing apparatus 100, plasma is generated between lower electrode 2 and upper electrode 6 which are arranged in parallel. Therefore, plasma processing apparatus 100 is a parallel-plate plasma processing apparatus.

An example of the parallel-plate plasma processing apparatus is a plasma etching apparatus. In the following description, it is assumed that plasma processing apparatus 100 is a plasma etching apparatus.

First, normal operation of plasma processing apparatus 100 will be described. Semiconductor wafer 5 is washed and placed on lower electrode 2 in chamber 1. Thereafter, a lid of chamber 1 is closed and the gas within chamber 1 is exhausted through exhaust port 8 with a vacuum pump (not shown). The gas within chamber 1 is exhausted with the vacuum pump until the pressure in chamber 1 reaches about $10^{-8}$ Pa. As a result, impurities such as oxygen introduced into chamber 1 when the lid thereof is opened are removed.

Thereafter, a reactive gas is introduced into chamber 1 through gas line 7, and the pressure in chamber 1 is kept at about 10 Pa to about 200 Pa. High-frequency power supply source 10 then generates high-frequency power and supplies it to lower electrode 2 through high-frequency matching box 9 and high-frequency current detector 11. High-frequency matching box 9 conducts impedance matching in order to efficiently supply the high-frequency power from high-frequency power supply source 10 to lower electrode 2.

As a result, electric discharge occurs between lower electrode 2 and upper electrode 6, whereby plasma is generated in chamber 1. Semiconductor wafer 5 is etched with ions within the generated plasma. After etching of semiconductor wafer 5 is completed, high-frequency power supply source 10 stops generating the high-frequency power, and the reactive gas in chamber 1 is exhausted with the vacuum pump. Thereafter, semiconductor wafer 5 is replaced with a new one. In other words, a new semiconductor wafer is placed on lower electrode 2, and the above operations are repeated.

If the above etching process is conducted for a long time, products would be produced by the etching. The products thus produced adhere to the inner wall of chamber 1 including stage 4 and upper electrode 6. Moreover, such a long etching process would wear out or degrade various parts of stage 4, or degrade the assembling accuracy due to the looseness of the fastened portion.

This changes high-frequency characteristics in plasma processing apparatus 100, and thus changes characteristics of the plasma generated in chamber 1 accordingly. As a result, the process performance of plasma processing apparatus 100 varies from the initial state or the state right after maintenance, thereby hindering a prescribed etching process from being conducted.

It is therefore required to detect the cause of the change in process performance before such a defective etching process occurs.

Hereinafter, a method for evaluating process performance of plasma processing apparatus 100 and detecting whether the process performance has changed or not will be described. The process performance is evaluated by supplying to lower electrode 2 high-frequency power in the range that does not cause generation of plasma within chamber 1. The reason for this is as follows: if high-frequency power in the range that causes generation of plasma within chamber 1 is supplied to lower electrode 2, the evaluated process performance would reflect also the characteristics of the generated plasma. This hinders detection of a change in high-frequency characteristics caused by a changed condition of the inner wall of chamber 1 resulting from, e.g., adhesion of products produced by the etching process.

In order to evaluate the process performance, high-frequency power supply source 10 generates high-frequency power in the range that does not cause generation of plasma in chamber 1, and supplies it to lower electrode 2 through high-frequency matching box 9 and high-frequency current detector 11. High-frequency current detector 11 detects a high-frequency current flowing through a high-frequency power feed portion from high-frequency power supply source 10 to lower electrode 2, and outputs the detected high-frequency current to computer 12.

Figure 2:
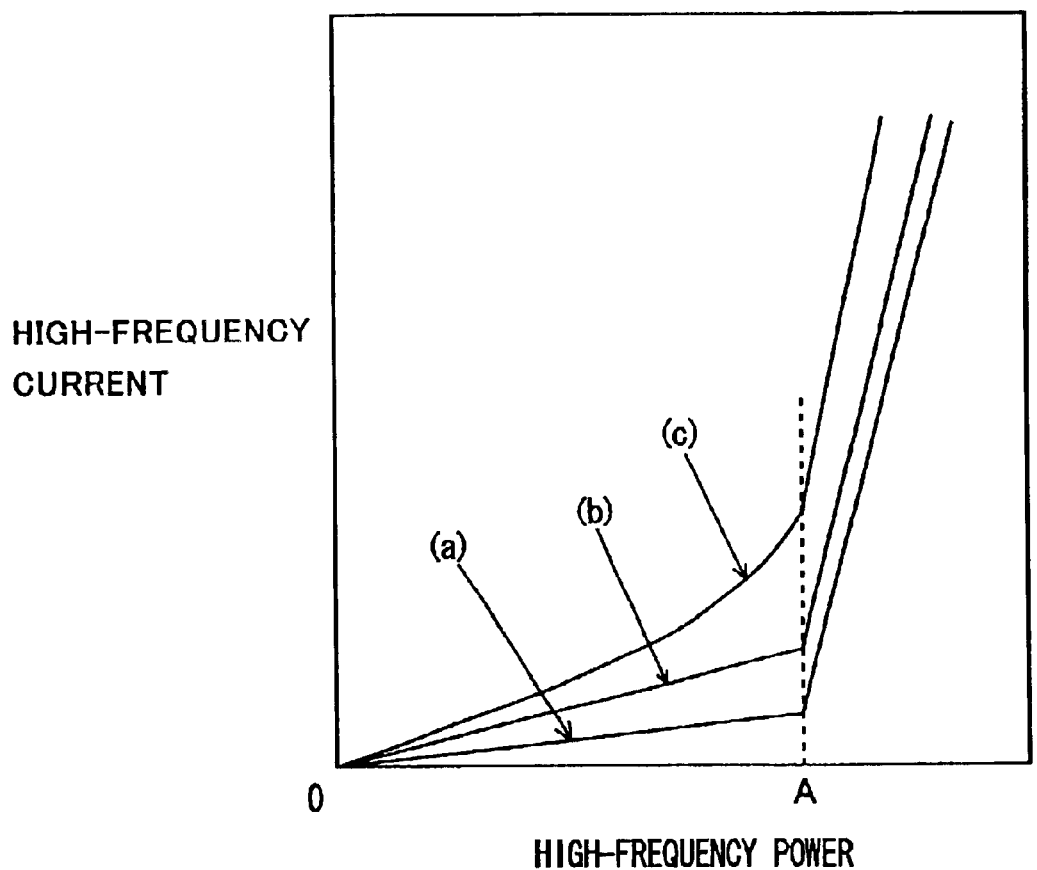
FIG. 2 shows the relation between high-frequency current and high-frequency power.

More specifically, as shown in FIG. 2, high-frequency power supply source 10 raises the high-frequency power from zero to A (the upper limit of the high-frequency power that does not cause generation of plasma within chamber 1). If the process performance is normal, high-frequency current detector 11 detects a high-frequency current shown by profile (a) in FIG. 2. If insulator 3 of stage 4 has worn out and the dimensions or thickness thereof has changed substantially, high-frequency current detector 11 detects a high-frequency current shown by profile (b) in FIG. 2. If the assembling accuracy of the parts of stage 4 is degraded or products produced by the etching process adhere to a region of stage 4 which is exposed to the plasma, high-frequency current detector 11 detects a high-frequency current shown by profile (c) in FIG. 2.

The range from zero to A shown in FIG. 2 corresponds to the range of the high-frequency power that does not cause generation of plasma within chamber 1. Therefore, when the high-frequency power in this range is supplied to lower electrode 2, a high-frequency current detected by high-frequency current detector 11 is a small current on the order of microamperes. Accordingly, high-frequency current detector 11 is preferably capable of detecting such a small current.

The high-frequency current detected by high-frequency current detector 11 is a leak current flowing from lower electrode 2 into chamber 1 which is at the ground potential through insulator 3, or a leak current flowing in the high-frequency power feed portion for supplying the high-frequency power to lower electrode 2.

Accordingly, when the parts of stage 4 including lower electrode 2 and insulator 3 are not degraded and thus the assembling accuracy is high, the impedance at stage 4 is stable. When the high-frequency power in the range from zero to A is supplied to lower electrode 2, the high-frequency current linearly increases with increase in high-frequency power, as shown by profile (a) in FIG. 2.

On the other hand, when insulator 3 wears out and the dimensions or thickness of insulator 3 changes substantially, the insulating property of insulator 3 is degraded and thus the insulation resistance of stage 4 is reduced. Accordingly, as shown by profile (b) in FIG. 2, the high-frequency current gradually becomes larger than that shown by profile (a) with increase in high-frequency power.

When the fastened portion between the parts of stage 4 is loosened or the products produced by the etching process adhere to stage 4, the stray capacitance or contact resistance between the parts of stage 4 becomes unstable and thus the impedance at stage 4 also becomes unstable. In this case, the high-frequency current increases non-linearly with increase in high-frequency power, as shown by profile (c) in FIG. 2.

Note that, regardless of whether stage 4 is in a normal state or not, plasma is generated within chamber 1 and the high-frequency current increases rapidly when the high-frequency power greater than A is supplied to lower electrode 2.

In the present invention, computer 12 stores profile (a) indicating stable impedance of stage 4 and normal process performance. Computer 12 compares a high-frequency current from high-frequency current detector 11 with the high-frequency current shown by profile (a), and evaluates whether the process performance is normal or not according to the comparison result.

More specifically, if the high-frequency current from high-frequency current detector 11 matches that shown by profile (a), computer 12 determines that the process performance is normal. Otherwise, computer 12 determines that the process performance is abnormal.

Preferably, when computer 12 determines that the process performance is abnormal, it determines how the high-frequency current from high-frequency current detector 11 varies from that shown by profile (a). In other words, computer 12 evaluates whether the high-frequency current from high-frequency current detector 11 is a high-frequency current shown by profile (b) or profile (c). This enables the location and cause of the change in process performance in plasma processing apparatus 100 to be specified.

More specifically, if the high-frequency current from high-frequency current detector 11 is a high-frequency current shown by profile (b), it is determined that insulator 3 have worn out and the dimensions or thickness thereof has changed substantially, as described above. If the high-frequency current from high-frequency current detector 11 is a high-frequency current shown by profile (c), it is determined that the fastened portion between the parts of stage 4 has been loosened or the products produced by the etching process adhere to stage 4, as described above.

In this way, whether the process performance is normal or not can be evaluated by detecting a high-frequency current produced when the high-frequency power in the range that does not cause generation of plasma is supplied to lower electrode 2 and comparing the detected high-frequency current with the high-frequency current shown by profile (a) which is the high-frequency current indicating normal process performance. Moreover, the location and cause of the change in process performance in plasma processing apparatus 100 can be specified by detecting how the detected high-frequency current varies from the high-frequency current indicating normal process performance.

In the above description, a high-frequency current is detected by supplying to lower electrode 2 the high-frequency power in the range that does not cause generation of plasma. However, a high-frequency voltage may alternatively be detected instead of the high-frequency current. The detected high-frequency voltage reflects the impedance at stage 4. Therefore, the process performance can be evaluated in the same manner as that described above.

The above method for evaluating high-frequency characteristics without generating plasma may be used in combination with a method for evaluating high-frequency characteristics with generation of plasma. In this case, the overall high-frequency characteristics of the apparatus are evaluated during the etching process to determine whether plasma processing apparatus 100 is operating normally or not. If plasma processing apparatus 100 is not operating normally, the high-frequency characteristics are evaluated without generating plasma by the method described above. If the high-frequency characteristics thus evaluated are normal, variation in plasma, upper electrode 6 and chamber 1 may be a possible cause of the change in process performance. In this way, the abnormal location can be rapidly specified.

Although the above description is given for a parallel-plate plasma processing apparatus, the present invention is not limited to this, and an inductively-coupled plasma processing apparatus may alternatively be used.

Although the above description is given for an etching apparatus, the present invention is not limited to this, and a film forming apparatus such as a plasma CVD (Chemical Vapor Deposition) apparatus using high-frequency discharge and a sputtering apparatus may alternatively be used.

According to the first embodiment, the plasma processing apparatus includes a high-frequency current detector for detecting a high-frequency current produced when the high-frequency power in the range that does not cause generation of plasma is supplied, and a computer for evaluating process performance by comparing the detected high-frequency current with a high-frequency current indicating normal process performance. Therefore, the location and cause of the change in process performance in the plasma processing apparatus can be rapidly specified.

[Second Embodiment]

Figure 3:
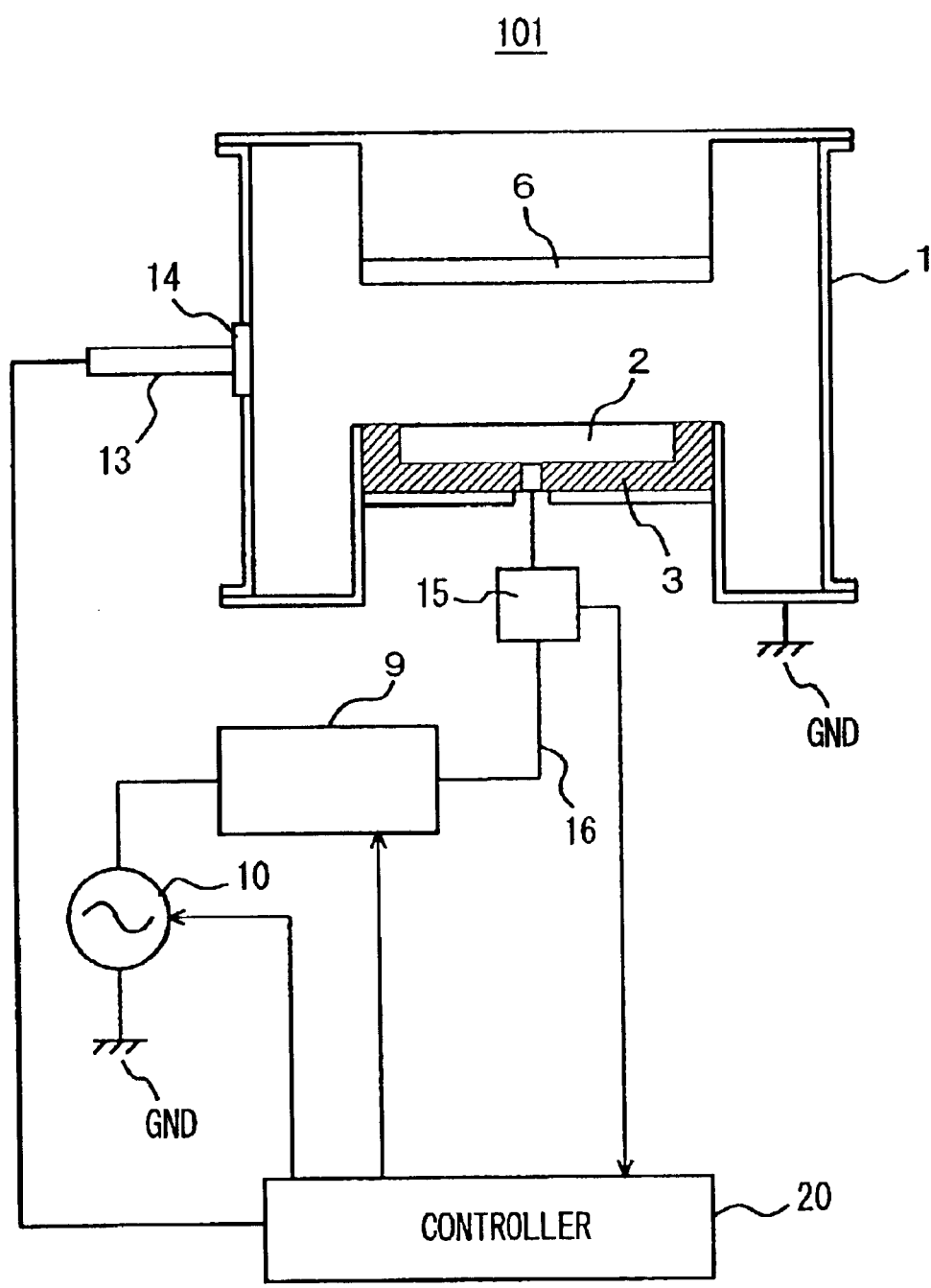
FIG. 3 is a schematic block diagram of a plasma processing apparatus according to a second embodiment of the present invention.

Referring to FIG. 3, a plasma processing apparatus 101 according to the second embodiment of the present invention includes a chamber 1, a lower electrode 2, an insulator 3, an upper electrode 6, a high-frequency matching box 9, a high-frequency power supply source 10, an emission sensor 13, a window 14, a monitor 15, a power feed line 16, and a controller 20. Note that the gas line and the exhaust port are eliminated in plasma processing apparatus 101.

Chamber 1, lower electrode 2, insulator 3, upper electrode 6, high-frequency matching box 9 and high-frequency power supply source 10 are the same as those described in the first embodiment.

Emission sensor 13 senses plasma emission in chamber 1, and converts the sensed plasma emission into an electric signal to output to controller 20. Emission sensor 13 is formed by a photomultiplier. Window 14 serves to guide the plasma emission generated within chamber 1 to emission sensor 13. Window 14 is formed from a material that does not absorb plasma. Window 14 has a light-shielding plate for preventing light (stray light) from the outside of chamber 1 to entering emission sensor 13.

Monitor 15 is connected between lower electrode 2 and high-frequency matching box 9. Monitor 15 detects both a high-frequency current flowing through power feed line 16 when the high-frequency power is supplied to lower electrode 2 and a high-frequency voltage generated by the high-frequency current flowing through power feed line 16, and outputs the detected high-frequency current and high-frequency voltage to controller 20.

Controller 20 controls high-frequency power supply source 10 and high-frequency matching box 9. Controller 20 receives the electric signal from emission sensor 13 and the high-frequency voltage and high-frequency current from monitor 15, and evaluates process performance of plasma processing apparatus 101 based on the received high-frequency voltage and high-frequency current. Controller 20 stops evaluation of the process performance when the intensity of the electric signal received from emission sensor 13 reaches a prescribed value.

Figure 4:
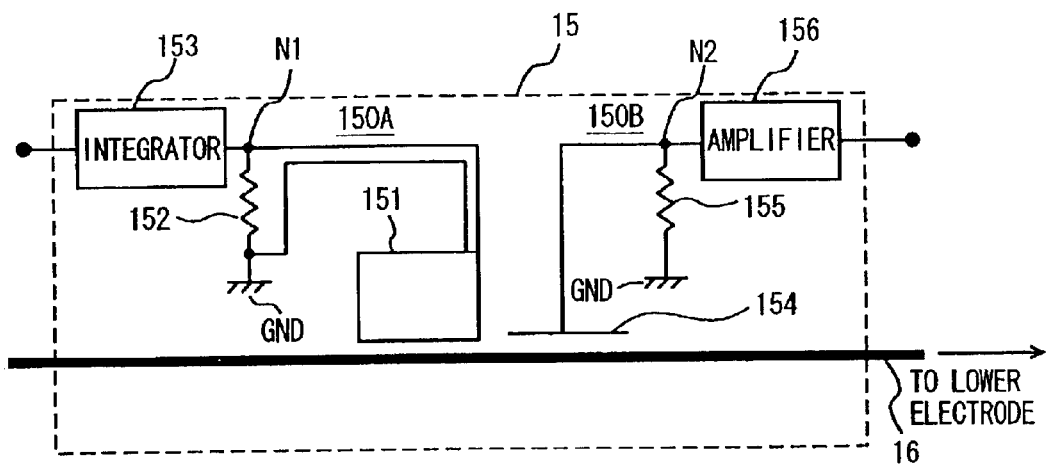
FIG. 4 is a circuit diagram of a monitor in FIG. 3.

Referring to FIG. 4, monitor 15 includes a current detector 150A and a voltage detector 150B. Current detector 150A includes a pickup coil 151, a resistive element 152 and an integrator 153. Pickup coil 151 is provided near power feed line 16. Pickup coil 151 has its one end connected to a ground node GND and the other node connected to a node N1. Resistive element 152 is connected between node N1 and ground node GND. Integrator 153 is connected to the other end of pickup coil 151. Integrator 153 integrates a voltage Vi generated on node N1 to obtain a high-frequency current.

When a high-frequency current flows through power feed line 16, a current is generated at pickup coil 151. The current thus generated flows through the circuit formed by pickup coil 151 and resistive element 152. Since the current flows through resistive element 152, voltage Vi is generated on node N1. In other words, when a high-frequency current flows through power feed line 16, voltage Vi is generated which is defined by the following equation:

$$Vi = M \times \frac{dI}{dt} \quad (1)$$

where M is a mutual inductance between power feed line 16 and pickup coil 151.

Accordingly, integrator 153 integrates voltage Vi on node N1 to obtain the high-frequency current based on the above equation (1).

Voltage detector 150B includes an electrode 154, a resistive element 155 and an amplifier 156. Electrode 154 is provided near power feed line 16. Resistive element 155 is connected between a node N2 and ground node GND. Amplifier 156 is connected to electrode 154 through node N2. Amplifier 156 integrates a voltage Vv induced at electrode 154 by a high-frequency current flowing through power feed line 16 and obtains a high-frequency voltage.

Electrode 154 is insulated from ground node GND. Therefore, when the high-frequency current flows through power feed line 16, voltage Vv is generated at electrode 154. Voltage Vv is defined by the following equation:

$$Vv = RC \times \frac{dV}{dt} \quad (2)$$

where R is a resistance value of resistive element 155, and C is capacitance between electrode 154 and power feed line 16.

Accordingly, amplifier 156 integrates voltage Vv induced at electrode 154 to obtain a high-frequency voltage by the above equation (2).

Note that pickup coil 151 is provided as near electrode 154 as possible in order to reduce the error of the phase difference θ between the high-frequency current detected by current detector 150A and the high-frequency voltage detected by voltage detector 150B.

The detected high-frequency current and high-frequency voltage are output to controller 20 through a coaxial cable.

This is in order to prevent the detected high-frequency current and high-frequency voltage from being affected by RF (Radio Frequency) noise.

Integrator 153 and amplifier 156 may alternatively be provided outside monitor 15.

When high-frequency power is supplied to lower electrode 2, a high-frequency current flows through power feed line 16. Monitor 15 detects high-frequency current I and high-frequency voltage V generated by this high-frequency current, and outputs the detected values I and V to controller 20.

Impedance Z is obtained based on high-frequency current I and high-frequency voltage V detected by monitor 15 ("high-frequency current I" herein means a current represented by a vector, and "high-frequency voltage V" herein means a current represented by a vector). Impedance Z thus obtained includes an impedance specific to the apparatus which is determined by the arrangement within chamber 1 of plasma processing apparatus 101 e.g., geometry such as arrangement of lower electrode 2 and upper electrode 6, an impedance of the high-frequency power feed portion from monitor 15 to lower electrode 2, an impedance of the ground line of plasma processing apparatus 101 (the return path of high-frequency current I), and the like.

Accordingly, detecting high-frequency current I and high-frequency voltage V by monitor 15 corresponds to detecting impedance Z.

When plasma processing apparatus 101 conducts a normal etching process, controller 20 controls high-frequency power supply source 10 so as to output prescribed high-frequency power. The operation is otherwise the same as that described in the first embodiment.

In order to evaluate process performance of plasma processing apparatus 101, the high-frequency power in the range that does not cause generation of plasma in chamber 1 is supplied to lower electrode 2. The reason for this is as follows: if high-frequency current I and high-frequency voltage V are detected with the plasma being generated in chamber 1, the impedance obtained based on the detected values I and V includes the impedance of plasma. Accordingly, the impedance specific to plasma processing apparatus 101 cannot be detected.

Figure 5:
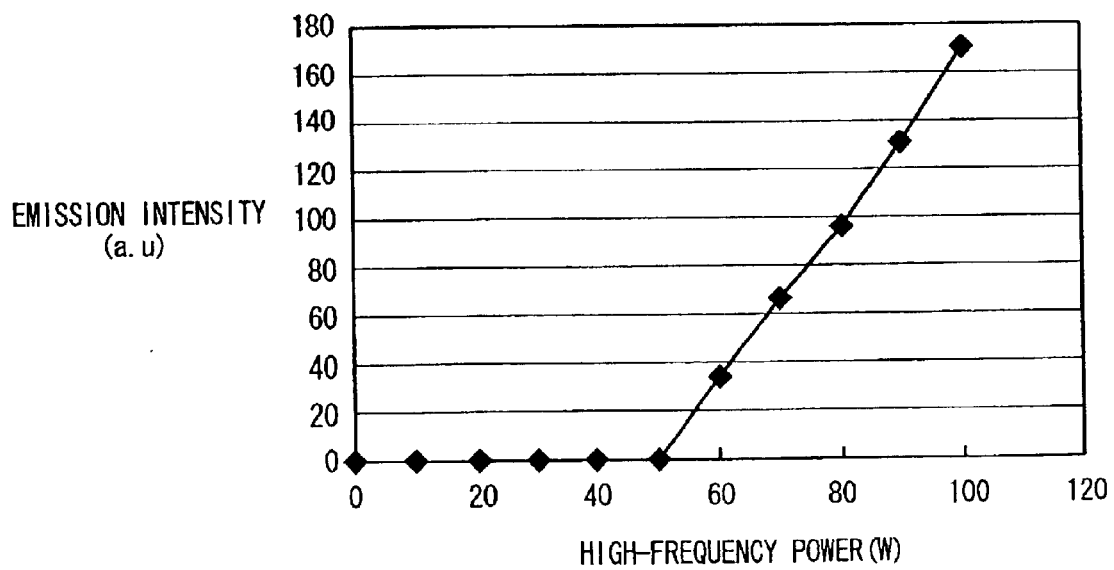
FIG. 5 shows the relation between emission intensity of plasma and high-frequency power.

FIG. 5 shows the relation between high-frequency power and intensity of plasma emission. The ordinate indicates emission intensity, and the abscissa indicates high-frequency power. The relation of FIG. 5 was measured when discharge occurred in chamber 1 under the following conditions: reactive gas: nitrogen; gas pressure: 66.5 Pa; gas flow rate: 100 sccm; distance between electrodes: 1 cm; and an object to be processed: none.

Referring to FIG. 5, no plasma emission is observed with the high-frequency power in the range of zero to 50 W. Plasma is generated with the high-frequency power in the range of 50 W to 60 W. Plasma emission is sensed at the high-frequency power of 60 W, and the intensity of the plasma emission increases with increase in high-frequency power.

Accordingly, high-frequency power of 10 W was herein supplied to evaluate the process performance of plasma processing apparatus 101.

High-frequency matching box 9 is forcibly stopped when the process performance of plasma processing apparatus 101 is evaluated. The reason for this is as follows: if high-frequency matching box 9 conducts automatic impedance matching, the high-frequency current and high-frequency voltage flowing through power feed line 16 are varied, thereby causing an error in the above impedance Z. This degrades reproducibility of the measurement.

Referring to FIG. 3 again, when the operation of evaluating the process performance of plasma processing apparatus 101 is started, controller 20 controls high-frequency power supply source 10 so as to generate high-frequency power of 10 W, and stops operation of high-frequency matching box 9. High-frequency power supply source 10 thus generates the high-frequency power of 10 W and supplies it to lower electrode 2 through high-frequency matching box 9, power feed line 16 and monitor 15.

Monitor 15 detects high-frequency current I and high-frequency voltage V by the above method, and outputs the detected values I and V to controller 20. Controller 20 obtains impedance Z based on the values I and V received from monitor 15. As described above, impedance Z thus obtained is the impedance specific to plasma processing apparatus 101. Controller 20 also obtains the phase difference θ between high-frequency current I and high-frequency voltage V. Controller 20 then evaluates process performance based on the obtained impedance Z and/or phase difference θ.

Emission sensor 13 continuously monitors plasma emission within chamber 1. When emission sensor 13 senses the plasma emission, it converts the sensed plasma emission into an electric signal to output to controller 20. As long as the intensity of the electric signal from emission sensor 13 does not exceed a prescribed value, controller 20 obtains impedance Z and phase difference θ based on high-frequency current I and high-frequency voltage V received from monitor 15. Controller 20 then evaluates the process performance based on the obtained impedance Z and/or phase difference θ.

Impedance Z thus obtained is the impedance of a high-frequency power feed portion from monitor 15 to lower electrode 2, a portion of lower electrode 2, and a return path for a return current to return from lower electrode 2 to high-frequency power supply source 10 through ground node GND of chamber 1. Accordingly, a change in impedance Z indicates a change in impedance in each of the above portions. The change in impedance Z therefore changes the etching capability of plasma processing apparatus 101.

Moreover, a change in phase difference θ also indicates a change in impedance in each of the above portions. The change in phase difference θ therefore changes the etching capability of plasma processing apparatus 101.

When there is a change in impedance Z, controller 20 determines that the process performance of plasma processing apparatus 101 has changed. On the other hand, when there is no change in impedance Z, controller 20 determines that there is no change in process performance of plasma processing apparatus 101.

Moreover, when there is a change in phase difference θ, controller 20 determines that the process performance of plasma processing apparatus 101 has changed. On the other hand, when there is no change in phase difference θ, controller 20 determines that there is no change in processing performance of plasma processing apparatus 101.

When there is a change in both impedance Z and phase difference θ, controller 20 determines that the process performance of plasma processing apparatus 101 has changed. On the other hand, when there is no change in impedance Z and phase difference θ, controller 20 determines that there is no change in process performance of plasma processing apparatus 101.

Controller 20 may evaluate the process performance based on either impedance Z or phase difference θ, or may evaluate the process performance based on both impedance Z and phase difference θ. Evaluation of the process performance is conducted periodically. When there is a change in impedance Z and/or phase difference θ, controller 20 determines that the process performance has changed, and maintenance of plasma processing apparatus 101 is conducted.

In the above description, the process performance of plasma processing apparatus 101 is evaluated by obtaining impedance Z and phase difference θ based on high-frequency current I and high-frequency voltage V detected by monitor 15. In the present invention, however, the process performance may alternatively be evaluated based on high-frequency current I and high-frequency voltage V detected by monitor 15. This is because high-frequency current I and high-frequency voltage V change according to the impedance of the high-frequency power feed portion from monitor 15 to lower electrode 2, the portion of lower electrode 2, and the return path for the return current to return from lower electrode 2 to high-frequency power supply source 10 through ground node GND of chamber 1.

Accordingly, controller 20 evaluates the process performance of plasma processing apparatus 101 by determining whether or not there is a change in high-frequency current I and high-frequency voltage V received from monitor 15.

Controller 20 evaluates the process performance of plasma processing apparatus 101 based on the high-frequency characteristics (high-frequency current I, high-frequency voltage V, impedance Z and phase difference θ) obtained when the high-frequency power of the range that does not cause generation of plasma is supplied to lower electrode 2. Controller 20 forcibly stops high-frequency power supply source 10 when the intensity of the electric signal received from emission sensor 13 exceeds a prescribed value. Evaluation of the process performance is thus stopped.

In the above description, a photomultiplier is used as emission sensor 13. However, a photodiode may alternatively be used as emission sensor 13. Since the photodiode is generally less sensitive than the photomultiplier, it is important to select a photodiode whose sensitivity corresponds to the spectral distribution of plasma emission.

Emission sensor 13 is a means for sensing generation of plasma in chamber 1 by using light. However, generation of plasma in chamber 1 may be sensed by using electricity. Hereinafter, various methods for sensing generation of plasma in chamber 1 will be described.

Figure 6:
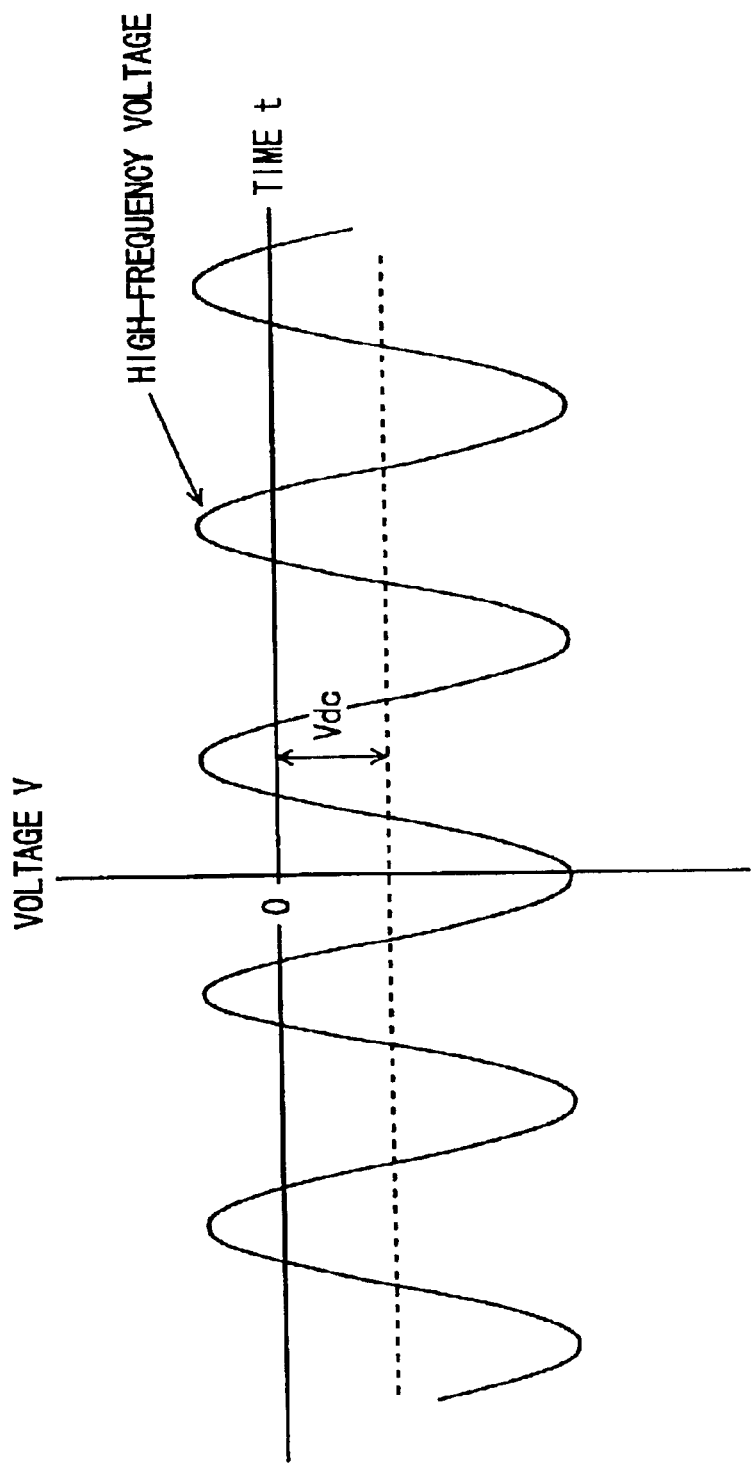
FIG. 6 is a waveform chart of a high-frequency voltage.

When plasma is generated in chamber 1, a DC (direct current) voltage called bias voltage Vdc as shown in FIG. 6 is superimposed on the high-frequency voltage applied to lower electrode 2, and therefore the voltage waveform is shifted in the negative direction. Accordingly, generation of plasma in chamber 1 can be sensed by detecting bias voltage Vdc.

In the plasma processing apparatus, a blocking capacitor is normally provided at the output of high-frequency matching box 9. This produces the difference between the rate at which electrons in the plasma are incident on lower electrode 2 and the rate at which ions in the plasma are incident on lower electrode 2. As a result, bias voltage Vdc is generated.

Figure 7:
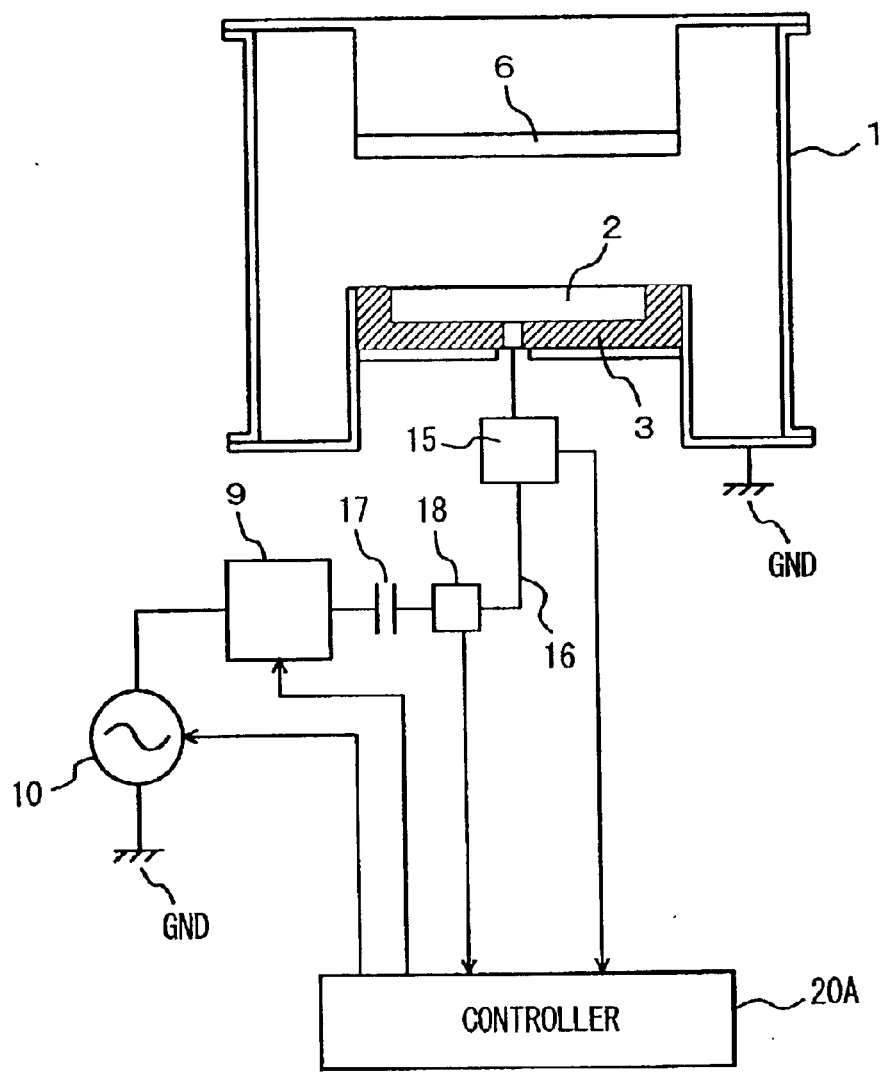
FIG. 7 is a schematic block diagram of another plasma processing apparatus according to the second embodiment.

FIG. 7 shows a plasma processing apparatus having a means for detecting bias voltage Vdc. Referring to FIG. 7, a plasma processing apparatus 102 is the same as plasma processing apparatus 101 except that emission sensor 13 and window 14 of plasma processing apparatus 101 are eliminated, controller 20 is replaced with a controller 20A, and a blocking capacitor 17 and a detector 18 are added.

Blocking capacitor 17 is connected to the output of high-frequency matching box 9. Detector 18 is connected between blocking capacitor 17 and monitor 15. When plasma is generated in chamber 1, detector 18 detects bias voltage Vdc and outputs it to controller 20A. In response to bias voltage Vdc from detector 18, controller 20A senses generation of plasma in chamber 1 and forcibly stops high-frequency power supply source 10. As a result, evaluation of process performance of plasma processing apparatus 102 is stopped.

Controller 20A evaluates the process performance based on high-frequency current I and high-frequency voltage V received from monitor 15 in the same manner as that of controller 20 as long as it does not receive bias voltage Vdc from detector 18.

An electrostatic chuck is widely used in recent plasma processing apparatuses. More specifically, in order to accurately control the temperature of an object to be processed i.e., a semiconductor wafer, a dielectric film is formed on the surface of lower electrode 2 on which the semiconductor wafer is to be placed, and a DC voltage is supplied to lower electrode 2 independently of high-frequency power supply source 10. As a result, the electrostatic force is generated between the semiconductor wafer and lower electrode 2, whereby the semiconductor wafer is adsorbed by lower electrode 2.

In the plasma processing apparatus using such an electrostatic chuck, detector 18 cannot detect bias voltage Vdc due to the influences of the dielectric film formed on the surface of lower electrode 2 on which the semiconductor wafer is to be placed.

In this case, it is possible to detect a discontinuous change in peak-to-peak voltage Vpp of high-frequency voltage V detected by monitor 15. When increased high-frequency power is applied and plasma is generated in chamber 1, the impedance of the plasma is added to the above impedance Z, and peak-to-peak voltage Vpp changes discontinuously during generation of the plasma. Therefore, controller 20, 20A obtains peak-to-peak voltage Vpp based on high-frequency voltage V received from monitor 15, and senses generation of plasma in chamber 1 when it detects a discontinuous change in the obtained peak-to-peak voltage Vpp. Once controller 20, 20A senses generation of plasma in chamber 1, it forcibly stops high-frequency power supply source 10 and terminates evaluation of the process performance.

Note that the above detector 18 and the means for detecting the peak-to-peak voltage may be provided in monitor 15.

Only a sensor for detecting high-frequency voltage V may be provided in power feed line 16, and a means for determining whether plasma is generated or not based on high-frequency voltage V detected by the sensor may be provided in another part of the apparatus.

An element for detecting bias voltage Vdc or peak-to-peak voltage Vpp is normally provided within high-frequency matching box 9. Therefore, bias voltage Vdc or peak-to-peak voltage Vpp may be detected by the element in high-frequency matching box 9.

In both the method for optically sensing generation of plasma and the method for electrically sensing generation of plasma (by using a voltage), it is necessary to detect in advance the range of high-frequency power that does not cause generation of plasma in chamber 1 and to detect the above high-frequency characteristics (high-frequency current I, high-frequency voltage V, impedance Z and phase difference θ) with the high-frequency power of the detected range. Detection of the high-frequency characteristics is stopped when bias voltage Vdc or a discontinuous change in peak-to-peak voltage Vpp is detected.

Introducing a reactive gas into chamber 1 is not necessarily required for detection of the high-frequency characteristics. However, for the safety reason, the plasma processing apparatuses often have an interlock mechanism that would not allow a high-frequency voltage to be supplied to lower electrode 2 without introducing a reactive gas into chamber 1.

It is now assumed that no reactive gas is introduced into chamber 1 and the pressure in chamber 1 is low or high (e.g., atmospheric pressure). If high-frequency power is applied to lower electrode under the above conditions, plasma would be generated at a higher voltage and the high-frequency power required to generate plasma is increased, as is known by the Paschen's law. Under these conditions, it is generally difficult to stably generate plasma, and discharge like arc discharge occurs, thereby often impeding functionality of lower electrode 2, upper electrode 6 and high-frequency power supply source 10.

It is therefore desirable to detect the high-frequency characteristics with a reactive gas introduced into chamber 1.

Figure 8:
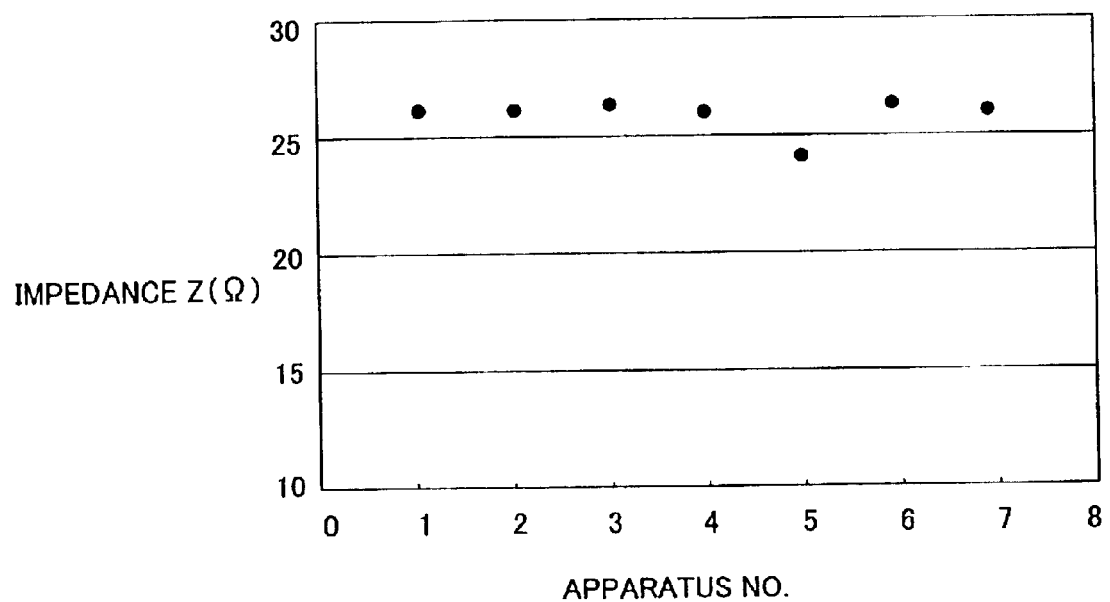
FIG. 8 shows the impedance detected in the plasma processing apparatus of FIG. 7.

In the example of FIG. 8, the impedance specific to a parallel-plate plasma processing apparatus (etching apparatus) was detected. FIG. 8 shows the detection result of seven plasma processing apparatuses adapted for 8-inch wafer.

The impedance detected in one of the seven plasma processing apparatuses is lower than that detected in the remaining plasma processing apparatuses.

The plasma processing apparatus having the lower impedance was examined during maintenance. It was found from the examination result that insulator 3 provided around lower electrode 2 was defective and this was the cause of the lower impedance.

Note that, in the above description, the high-frequency characteristics are detected without placing a semiconductor wafer on lower electrode 2. In the present invention, however, the high-frequency characteristics may alternatively be detected with a semiconductor wafer placed on lower electrode 2.

In the above description, a parallel-plate plasma processing apparatus is used as plasma processing apparatus 101, 102. In the present invention, however, an inductively-coupled plasma processing apparatus may alternatively be used.

According to the second embodiment, the plasma processing apparatus includes a monitor for detecting the high-frequency characteristics with the high-frequency power of the range that does not cause generation of plasma, and a controller for evaluating the process performance based on the detected high-frequency characteristics. Therefore, whether the process performance has changed or not can be detected by detecting whether the high-frequency characteristics have changed or not.

[Third Embodiment]

Figure 9:
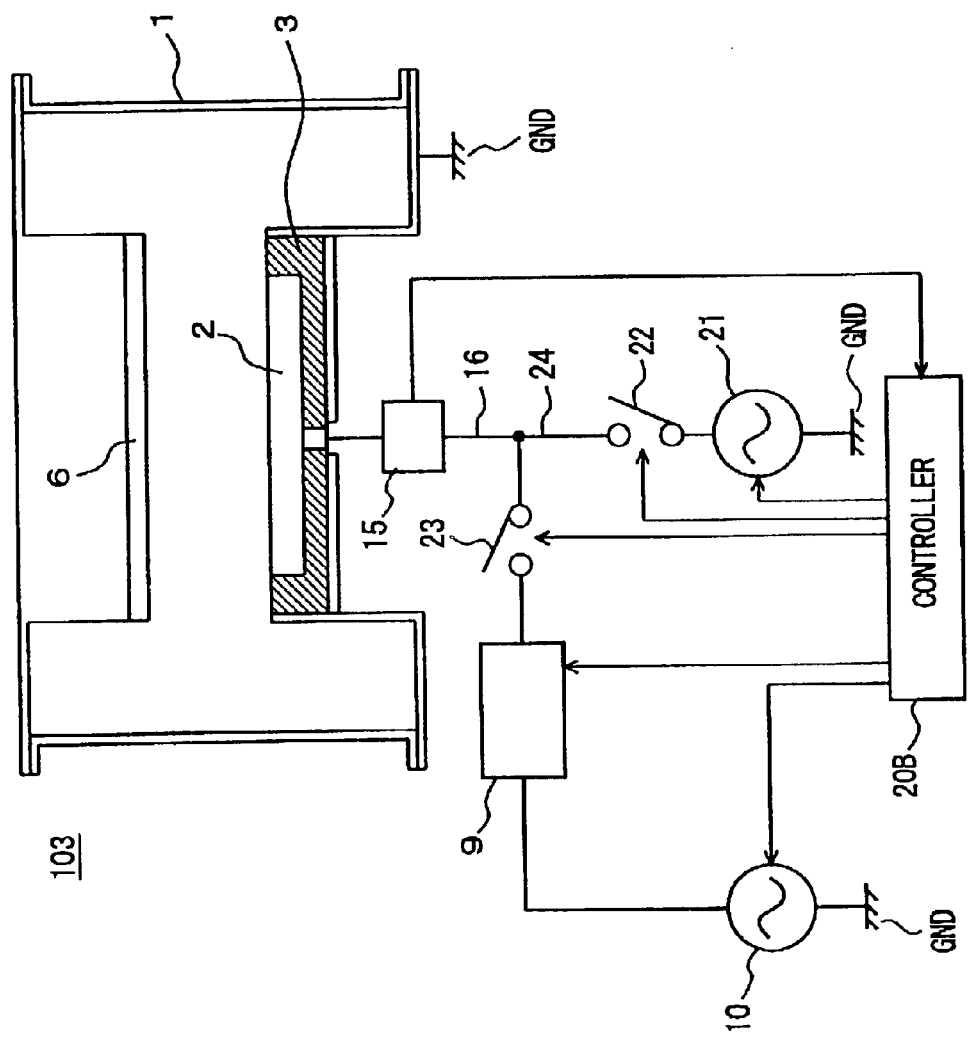
FIG. 9 is a schematic block diagram of a plasma processing apparatus according to a third embodiment of the present invention.

Referring to FIG. 9, a plasma processing apparatus 103 according to the third embodiment of the present invention is the same as plasma processing apparatus 101 except that a high-frequency power supply source 21, switches 22, 23 and a power feed line 24 are added, and controller 20 is replaced with a controller 20B.

Power feed line 24 is connected to power feed line 16, and switch 22 is connected to power feed line 24. High-frequency power supply source 21 supplies the high-frequency power to lower electrode 2 in response to turning ON of switch 22, and stops supplying the high-frequency power to lower electrode 2 in response to turning OFF of switch 22.

High-frequency power supply source 21 is connected between switch 22 and ground node GND, and generates high-frequency power in the range that does not cause generation of plasma in chamber 1. Note that high-frequency power supply source 21 generates high-frequency power having the same frequency as that of high-frequency power supply source 10 (13.56 MHz). Switch 23 is connected between high-frequency matching box 9 and power feed line 16.

Controller 20B controls high-frequency power supplies 10, 21, high-frequency matching box 9 and switches 22, 23.

More specifically, when plasma processing apparatus 103 is used as an apparatus for etching a semiconductor wafer, controller 20B turns OFF switch 22 to stop high-frequency power supply source 21, and turns ON switch 23 to drive high-frequency power supply source 10 and high-frequency matching box 9. In order to detect impedance Z specific to plasma processing apparatus 103, controller 20B turns ON switch 22 to drive high-frequency power supply source 21, and turns OFF switch 23 to stop high-frequency power supply source 10 and high-frequency matching box 9.

In the normal operation, high-frequency power is supplied from high-frequency power supply source 10 to lower electrode 2 and the semiconductor wafer is etched in plasma processing apparatus 103. When evaluating the process performance, high-frequency power is supplied from high-frequency power supply source 21 to lower electrode 2 and the impedance Z specific to the apparatus is detected by the same method as that described above in plasma processing apparatus 103. The operation of etching the semiconductor wafer is the same as that described in the first embodiment, and the operation of detecting impedance Z is the same as that described in the second embodiment.

According to the third embodiment, high-frequency power supply source 21 for generating low high-frequency power in the range that does not cause generation of plasma is provided in order to detect impedance Z. This enables monitor 15 to measure high-frequency current I and high-frequency voltage V with high accuracy, allowing for accurate detection of impedance Z and phase difference θ.

The plasma processing apparatus of the third embodiment is thus characterized in that it includes a high-frequency power supply source for generating high-frequency power in the range that does not cause generation of plasma in chamber 1 in order to detect the high-frequency characteristics specific to the apparatus.

High-frequency power supply source 21 normally generates high-frequency power as small as about several watts. Therefore, high-frequency power supply source 21 is capable of stably outputting the high-frequency power in the range that does not cause generation of plasma. As a result, it needs hardly to provide to the plasma processing apparatus a means for detecting whether plasma is generated in chamber 1 or not.

In the example described below, a network analyzer is used as a means for generating high-frequency power in the range that does not cause generation of plasma in chamber 1.

The network analyzer generates high-frequency power in the range that does not cause generation of plasma, and measures high-frequency characteristics of an object to be measured (in the third embodiment, plasma processing apparatus) based on the measurement result of a reflection coefficient and a transmission coefficient of the object regarding the intrinsic impedance of the measuring system.

Figure 10:
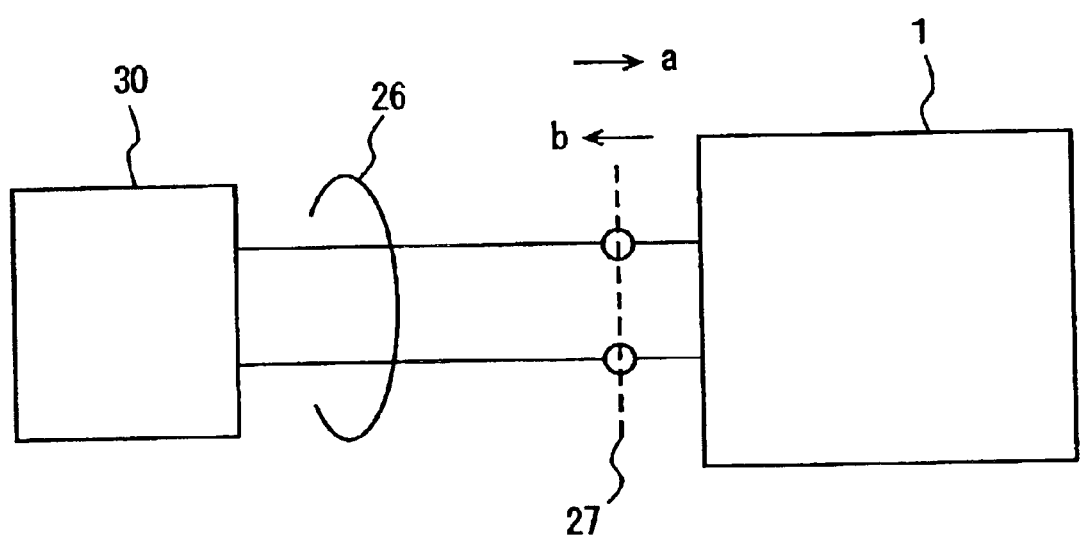
FIG. 10 illustrates a method for measuring the impedance by a network analyzer in FIG. 9.

Hereinafter, a method for detecting high-frequency characteristics (impedance Z) of the plasma processing apparatus by using the network analyzer will be described with reference to FIG. 10. Network analyzer 30 and chamber 1 are connected to each other through a power feed line 26 having an intrinsic impedance Z0. In this case, high-frequency power supplied from network analyzer 30 to chamber 1 is normally reflected due to impedance mismatch. Provided that a voltage of the signal incident on chamber 1 at a connection 27 and a voltage of the signal reflected therefrom at connection 27 are respectively represented by complex vectors a, b having an amplitude and a phase, a reflection coefficient Γ of the voltage is defined by the following equation:

$$\Gamma = \frac{b}{a} \quad (3)$$

Impedance Z of the plasma processing apparatus is therefore defined by the following equation using reflection coefficient Γ of the voltage and intrinsic impedance Z0 of power feed line 26:

$$Z = Z0 \times \frac{1+\Gamma}{1-\Gamma} \quad (4)$$

It can be appreciated from the above equation (4) that, for Z=Z0, reflection coefficient Γ of the voltage is equal to zero and no reflected wave is produced. This condition is generally called "impedance matching condition".

Accordingly, by measuring intrinsic impedance Z0 of power feed line 26 in advance, impedance Z specific to the plasma processing apparatus can be obtained according to the above equations (3) and (4) by detecting an incident wave a and reflected wave b by network analyzer 30.

Figure 11:
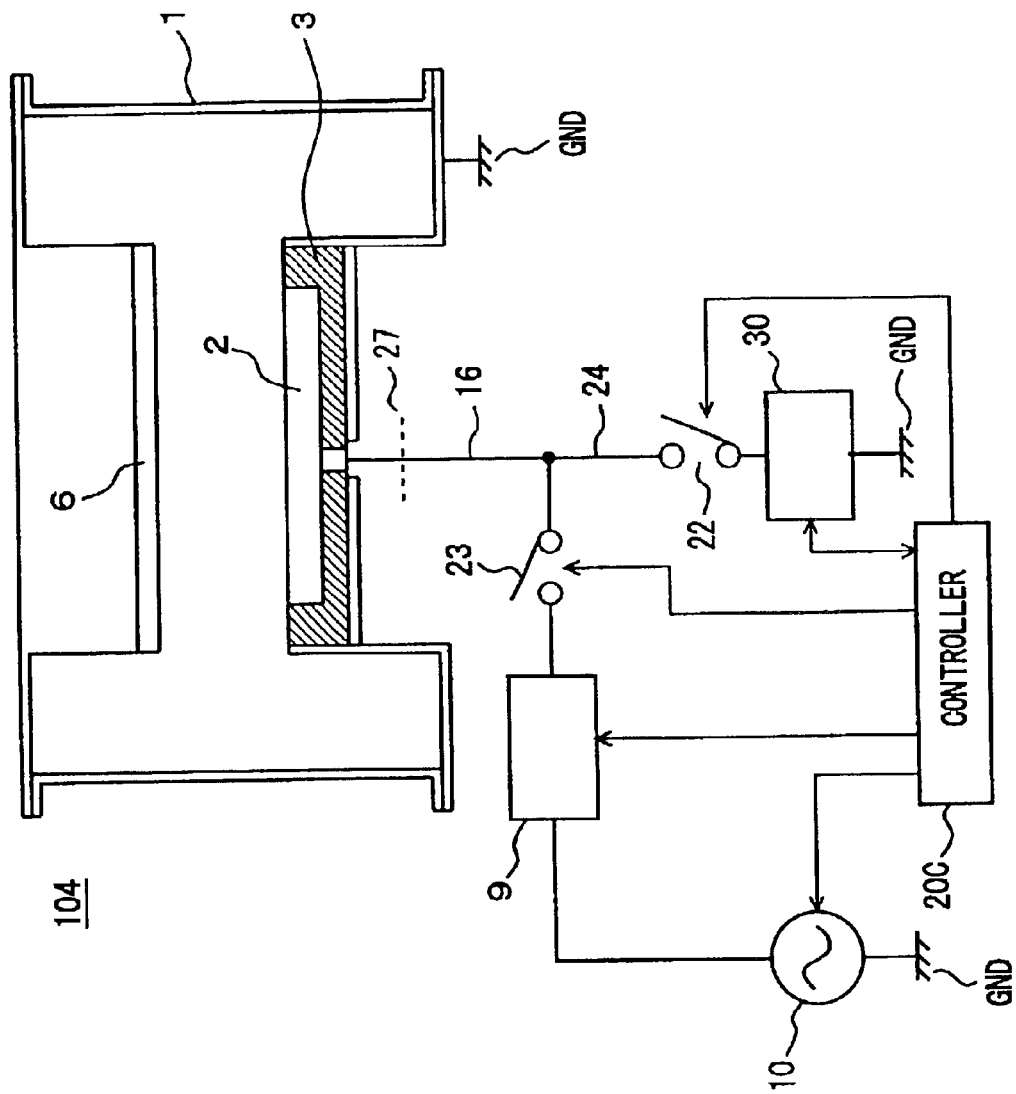
FIG. 11 is a schematic block diagram of another plasma processing apparatus according to the third embodiment.

Referring to FIG. 11, a plasma processing apparatus 104 is the same as plasma processing apparatus 103 except that monitor 15 and high-frequency power supply source 21 in plasma processing apparatus 103 are replaced with network analyzer 30, and controller 20B is replaced with a controller 20C.

Network analyzer 30 generates high-frequency power in the range that does not cause generation of plasma in chamber 1, and supplies it to lower electrode 2. Network analyzer 30 detects incident wave a and reflected wave b of a high-frequency voltage at connection 27, and outputs them to controller 20C.

Controller 20C controls high-frequency matching box 9, high-frequency power supply source 10, switches 22, 23 and network analyzer 30.

In order to detect impedance Z specific to the apparatus, controller 20C turns ON switch 22 to drive network analyzer 30 and turns OFF switch 23 to stop high-frequency matching box 9 and high-frequency power supply source 10. Network analyzer 30 generates high-frequency power in the range that does not cause generation of plasma in chamber 1 and supplies it to lower electrode 2. Network analyzer 30 then detects incident wave a and reflected wave b of the high-frequency voltage at connection 27, and outputs them to controller 20C.

Controller 20C obtains impedance Z specific to plasma processing apparatus 104 according to the above equations (3) and (4).

In order to remove the influences of the impedance of the high-frequency power feed portion (power feed lines 16, 24), i.e., the portion from network analyzer 30 to connection 27, the impedance of power feed lines 16, 24 is calibrated in advance by inserting a known reference impedance into connection 27. In the third embodiment, the impedance of power feed lines 16, 24 is 50 Ω.

Figure 12:
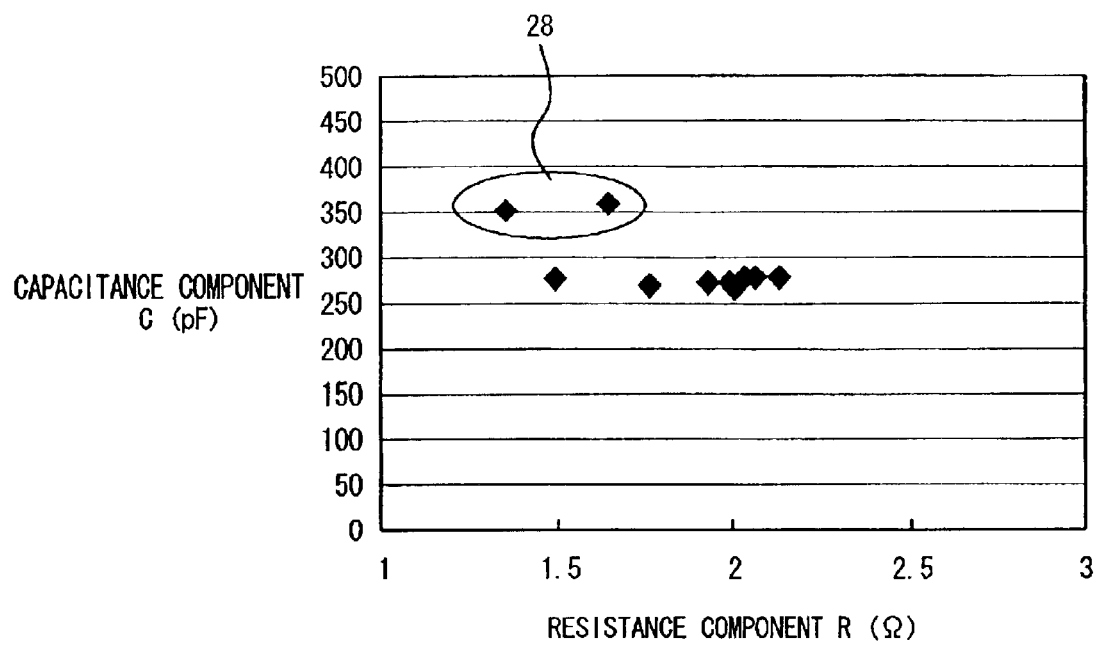
FIG. 12 shows a capacitance component and a resistance component of the impedance detected in the plasma processing apparatus of FIG. 11.

FIG. 12 shows a resistance component R and a capacitance component C of impedance Z obtained by the above method. Eleven plasma processing apparatuses were used for measurement of impedance Z. Two of the eleven plasma processing apparatuses (those shown by reference numeral 28) have a greater capacitance component C than that of the remaining plasma processing apparatuses.

The products processed by the two plasma processing apparatuses having a greater capacitance component C were examined when the measurement of impedance Z was conducted. It was found from the examination result that a "side-etching phenomenon" is more likely to occur in the products produced by the above two plasma processing apparatuses. More specifically, these products are more likely to have a reduced wiring width because the sidewall of an aluminum wiring is etched. Therefore, maintenance was conducted for the above two plasma processing apparatuses.

Figure 13:
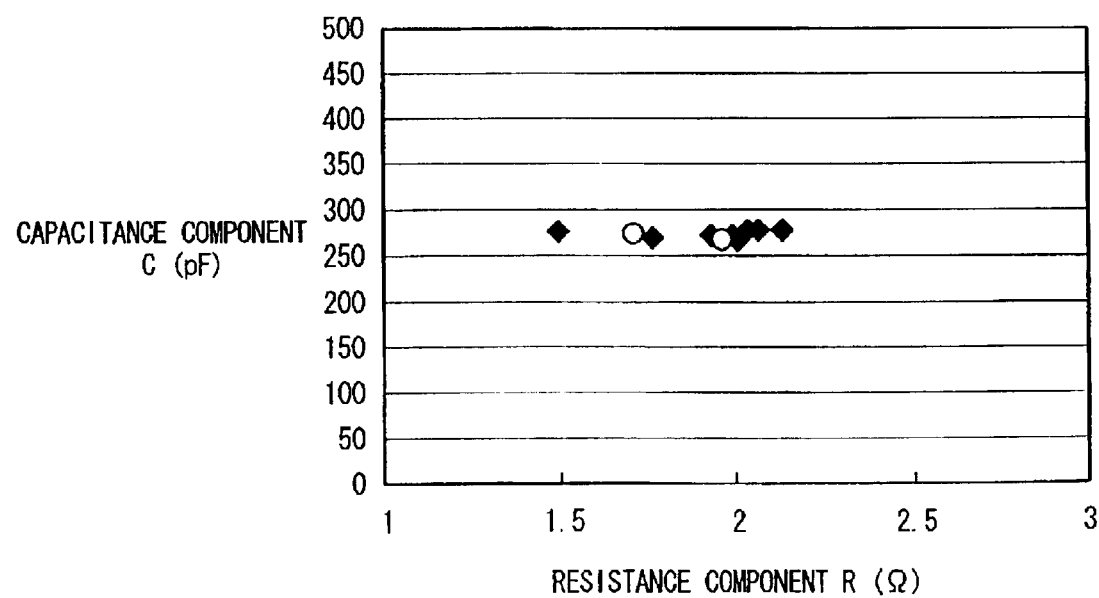
FIG. 13 shows a capacitance component and a resistance component of the impedance detected in the plasma processing apparatus of FIG. 11.

After maintenance, impedance Z was measured again by the above method. FIG. 13 shows the measurement result. In FIG. 13, each white circle indicates a resistance component R and a capacitance component C of impedance Z in the two plasma processing apparatuses having a greater capacitance component C in FIG. 12 (i.e., plasma processing apparatuses shown by reference numeral 28 in FIG. 12). As shown in FIG. 13, respective capacitance components C of these plasma processing apparatuses are approximately equal to those of the other plasma processing apparatuses. After maintenance, no side-etching phenomenon was observed in the etching process of a semiconductor wafer. It was found from the above result that the change in capacitance component were mainly caused by degraded assembling accuracy of the parts in chamber 1 and degradation of the insulating member.

The causes of the change in process performance can thus be specified by measuring impedance Z specific to plasma processing apparatus 104 by using network analyzer 30 provided separately from high-frequency power supply source 10.

More specifically, impedance Z specific to plasma processing apparatus 104 is greatly affected by the difference in the assembling state of plasma processing apparatus 104, the difference in length of, e.g., a cable depending on the installation location of plasma processing apparatus 104, the difference in the state of the ground of plasma processing apparatus 104, and wear, abrasion and corrosion of the parts such as lower electrode 2 and upper electrode 6 in plasma processing apparatus 104, and the like. Therefore, by measuring impedance Z specific to plasma processing apparatus 104 and detecting a change in impedance Z by the above method, the location of the cause of a change in impedance Z can be specified in plasma processing apparatus 104.

Note that specific examples of the difference in the assembling state of plasma processing apparatus 104 include variation in contact resistance resulting from the difference in fastening toque of a member such as a bolt, variation in electrostatic capacitance resulting from the difference in distance between the parts, and the like.

In plasma processing apparatus 104, network analyzer 30 turns OFF the switch 23 to measure impedance Z. However, impedance Z may alternatively be measured by disconnecting high-frequency power supply source 10 at connection 27 and directly connecting network analyzer 30 to connection 27.

The above description is given for the plasma processing apparatus using the network analyzer. In the present invention, however, impedance Z may alternatively be detected by using an LCR (inductance-capacitance-resistance) bridge. The LCR bridge can be used especially when impedance Z is measured at a frequency of 10 MHz or less.

The above description is given for the parallel-plate plasma processing apparatus. Therefore, the components of impedance Z to be evaluated are a resistance component R and a capacitance component C. When an inductively-coupled plasma processing apparatus is used, however, the components of impedance Z to be evaluated are a resistance component R and an inductive reactance component L.

The third embodiment is otherwise the same as the second embodiment.

According to the third embodiment, the plasma processing apparatus includes, in addition to the original high-frequency power supply source, a network analyzer for measuring the impedance of the plasma processing apparatus by generating high-frequency power in the range that does not cause generation of plasma in the chamber and detecting an incident wave and a reflected wave of a high-frequency voltage supplied to the lower electrode. This enables accurate measurement of the impedance specific to the apparatus that does not include the impedance of plasma.

Detecting variation in the measured impedance enables accurate evaluation of the difference in process performance between the plasma processing apparatuses.

Moreover, the impedance is measured before and after relocation or maintenance of the plasma processing apparatus or the like in order to confirm that there is no change in the measured impedance. This facilitates evaluation of process reproducibility and enables reduction in the number of semiconductor wafers to be used for evaluation of process reproducibility.

[Fourth Embodiment]

Figure 14:
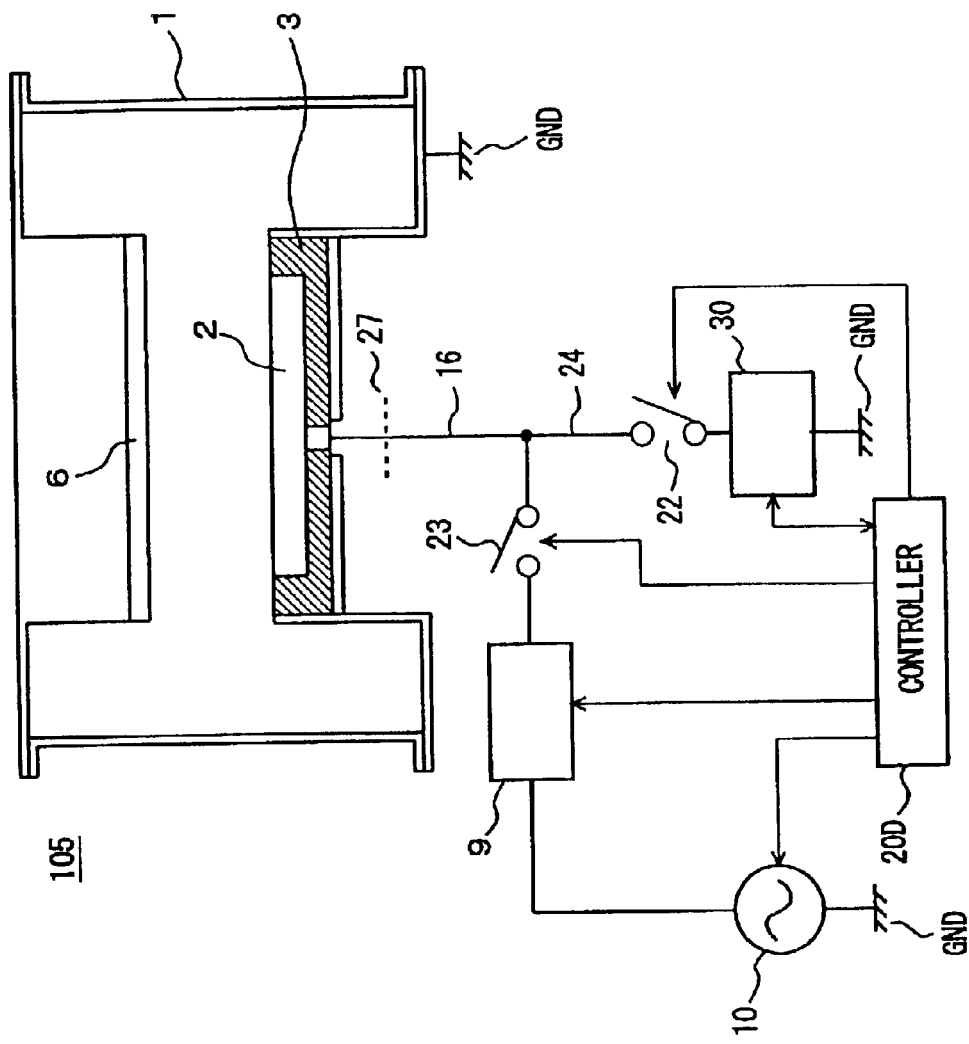
FIG. 14 is a schematic block diagram of a plasma processing apparatus according to a fourth embodiment of the present invention.

Referring to FIG. 14, a plasma processing apparatus 105 according to the fourth embodiment of the present invention is the same as plasma processing apparatus 104 except that controller 20C is replaced with a controller 20D.

Network analyzer 30 is capable of sweeping the frequency of high-frequency power. Controller 30D controls high-frequency matching box 9, high-frequency power supply source 10 and switches 22, 23, and also controls network analyzer 30 so as to vary the frequency of the high-frequency power.

Plasma processing apparatus 105 is characterized in that, in order to measure impedance Z specific to the apparatus, network analyzer 30 supplies high-frequency power having different frequencies to chamber 1 and detects an incident wave and a reflected wave at connection 27 for each frequency.

Figure 15:
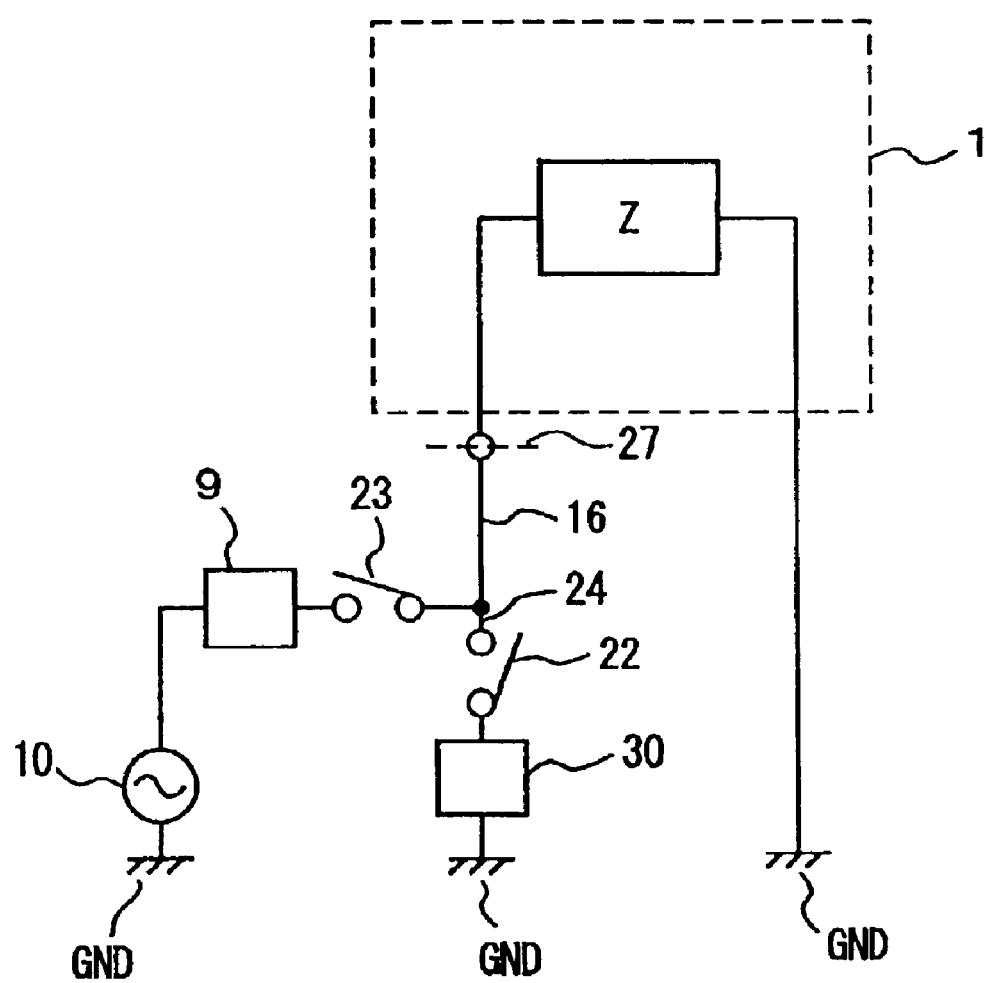
FIG. 15 shows an equivalent circuit of the plasma processing apparatus when high-frequency power having a fixed frequency is supplied.

When network analyzer 30 generates high-frequency power having a fixed frequency for measurement of the impedance of plasma processing apparatus 105, the impedance from connection 27 to chamber 1 can be represented by impedance Z as shown in FIG. 15. Impedance Z is defined by the following equation:

$$Z = R + jX$$

$$X = 1/\omega C \text{ or } X = \omega L \quad (5)$$

When plasma processing apparatus 105 is a parallel-plate plasma processing apparatus, $X=1/\omega C$. When plasma processing apparatus 105 is an inductively-coupled plasma processing apparatus, $X=\omega L$.

Therefore, by detecting an incident wave and a reflected wave at connection 27 when high-frequency power having a single frequency is supplied to lower electrode 2, unknowns R, C (or L) can be obtained according to the above equations (3) to (5).

Figure 16:
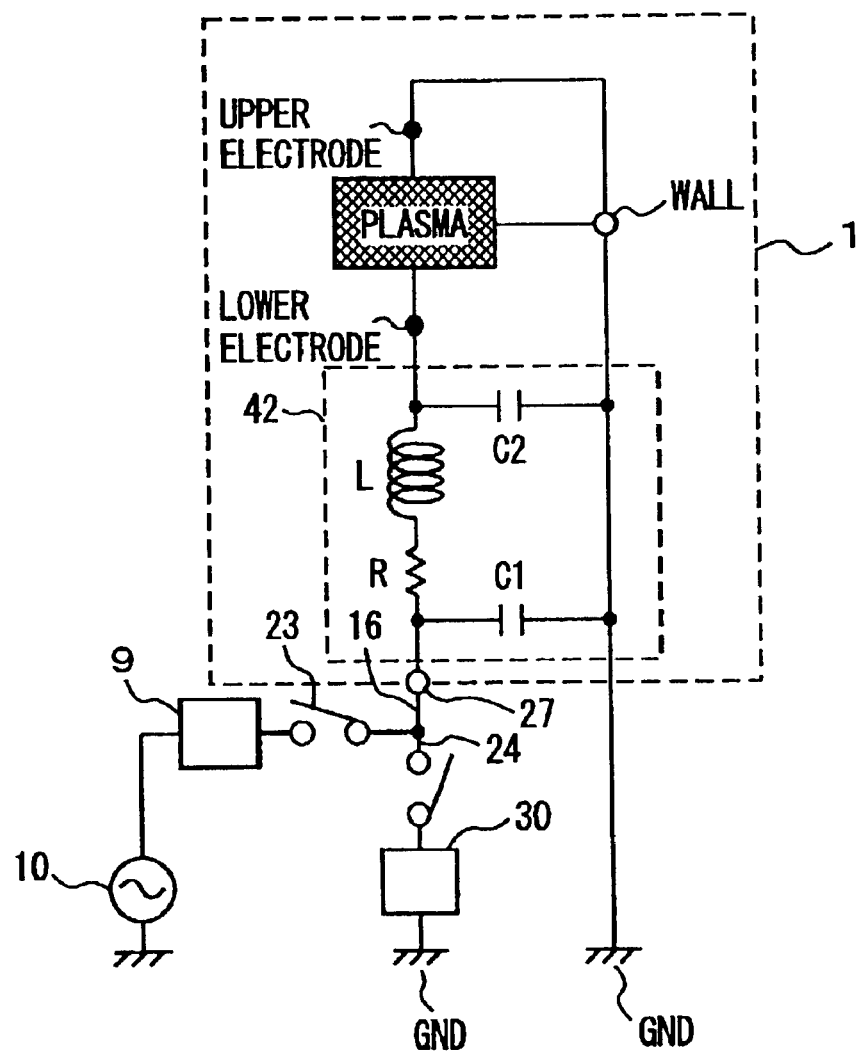
FIG. 16 shows an equivalent circuit of the plasma processing apparatus when high-frequency power is supplied with the frequency thereof being varied.

When the high-frequency power is to be supplied to the lower electrode while varying the frequency thereof, an equivalent circuit 42 is inserted between connection 27 and the lower electrode of chamber 1, as shown in FIG. 16. Equivalent circuit 42 includes a resistance R, capacitances C1, C2 and a reactance L. In this case, impedance Z specific to plasma processing apparatus 105 is defined by the following equation:

$$Z = \frac{\frac{1}{\omega C_1}\left[\left(\omega L - \frac{1}{\omega C_2}\right) + iR\right]}{R + i\left(\omega L - \frac{1}{\omega C_1} - \frac{1}{\omega C_2}\right)} \quad (6)$$

where C1 is a parasitic capacitance between the high-frequency portion from connection 27 to lower electrode 2 and the ground, and C2 is a parasitic capacitance of insulator 3 inserted between lower electrode 2 and chamber 1 which has at the ground potential.

When impedance Z specific to plasma processing apparatus 105 is defined by the above equation (6), unknowns C1, C2, R, L in the equation (6) cannot be obtained by the method for detecting an incident wave and a reflected wave at connection 27 by supplying high-frequency power having a fixed frequency to lower electrode 2.

Network analyzer 30 therefore supplies the high-frequency power to lower electrode 2 while varying the frequency thereof, and detects an incident wave and a reflected wave at connection 27 for each frequency. Controller 20D obtains impedance Z and phase difference θ between high-frequency current and high-frequency voltage for each frequency.

Figure 17:
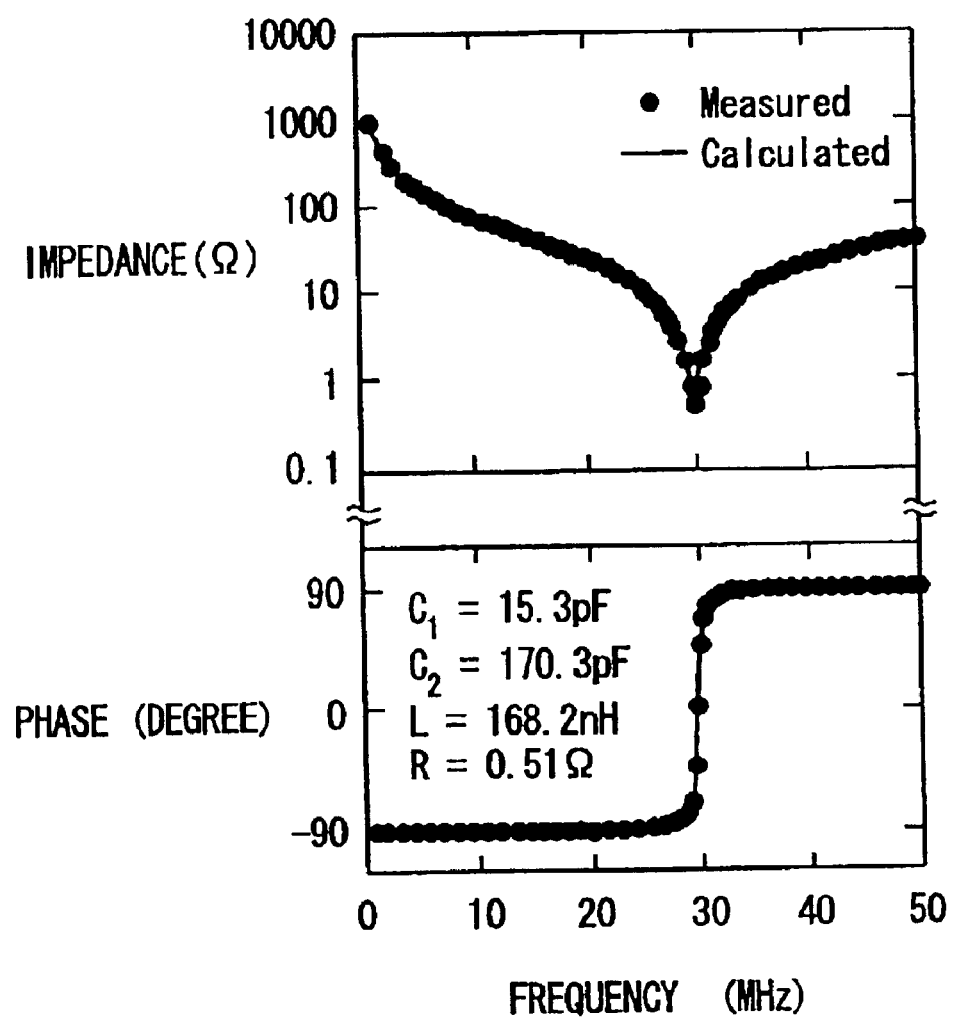
FIG. 17 shows frequency dependence of the impedance and the phase.

FIG. 17 shows the frequency dependence of impedance Z and phase difference θ. In this example, the frequency of high-frequency power was varied in the range of 1 MHz to 50 MHz. Chamber 1 of plasma processing apparatus 105 has a diameter of 20 cm, and lower electrode 2 and upper electrode 6 have a diameter of 10 cm. The distance between lower electrode 2 and upper electrode 6 is 2 cm. Chamber 1 is evacuated with a vacuum pump (not shown). Network analyzer 30 varies the frequency from 1 MHz to 50 MHz in increments of 1 MHz.

As the frequency of high-frequency power is increased, impedance Z is minimized at about 30 MHz and increases at a frequency exceeding about 30 MHz. Phase difference θ is −90 degrees (i.e., capacitive load) at a frequency in the range of zero to about 30 MHz, and abruptly changes to +90 degrees (i.e., inductive load) at a frequency exceeding about 30 MHz.

Therefore, impedance Z was measured with the frequency being finely varied around 30 MHz. As a result, impedance Z was minimized and phase difference θ becomes zero at 29.72 MHz. Accordingly, 29.72 MHz is a resonance frequency of plasma processing apparatus 105.

Fitting operation is conducted using four points around i.e., lower and higher than, the resonance frequency (29.72 MHz), whereby unknowns C1, C2, R, L of equivalent circuit 42 are obtained (it should be note that the resonance frequency is herein included in the four points). In this way, the impedance specific to the apparatus can be detected.

Note that the resonance frequency need not necessarily be included in the points used in the fitting operation. For improved fitting accuracy, however, it is preferable to use the points including the resonance frequency.

It is also preferable to measure impedance Z by using the frequencies higher and lower than the resonance frequency rather than using only the frequencies higher or lower than the resonance frequency.

In FIG. 17, each black circle indicates an actually measured value, and solid line indicates the fitting result. The fitting operation was conducted using every point of the frequency varied in increments of 1 MHz. The fitting result exactly matches the measured values.

The obtained unknowns C1, C2, R, L of equivalent circuit 42 are as follows: C1=15.3 pF; C2=170.3 pF; L=168.2 nH; and R=0.51 Ω. In this example, insulator 3 is alumina ceramics.

When insulator 3 is tetrafluoroethylene (Teflon®) and has the same shape, the obtained unknowns C1, C2, R, L are as follows: C1=11.9 pF; C2=126.4 pF; L=152.9 nH; and R=0.61 Ω.

It was found from the above result that C2 significantly varies between alumina ceramics and Teflon®. This is because alumina ceramics has a greater dielectric constant than tetrafluoroethylene.

The above result is shown by Table 1 below.

TABLE 1

| Material of Insulator 3 | $Al_2O_3$ | Teflon |
|---|---|---|
| $F_{res}$ (MHz) | 29.72 | 36.2 |
| $C_1$ (pF) | 15.3 | 11.9 |
| $C_2$ (pF) | 170.3 | 126.4 |
| L (nH) | 168.2 | 152.9 |
| R (Ω) | 0.51 | 0.61 |

Note that the measurement error is about 0.1%, which indicates excellent reproducibility.

An equivalent circuit can be similarly considered for the other parts of plasma processing apparatus 105, and a circuit constant of the equivalent circuit can be obtained based on the measured impedance.

Accordingly, by obtaining impedance Z with the frequency of high-frequency power being varied by network analyzer 30, a change in dimensions of each part of plasma processing apparatus 105, a change in condition (such as ablation and wear) of each part of plasma processing apparatus 105, and assembling accuracy can be monitored with high accuracy. As a result, variation in process performance between plasma processing apparatuses and aging of the plasma processing apparatus can be quantitatively known, thereby contributing to stable operation of the plasma processing apparatuses.

Figure 18:
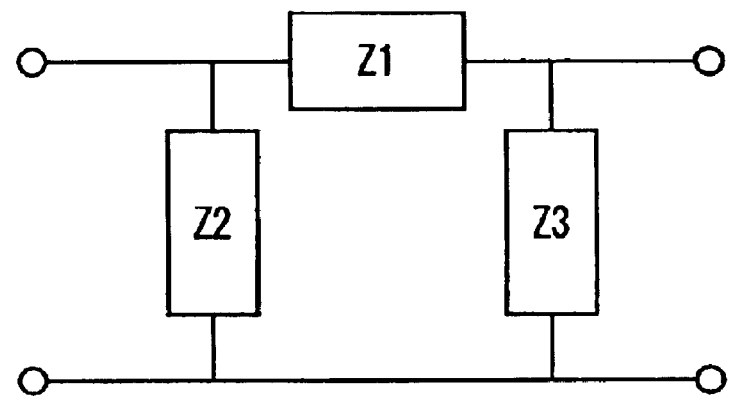
FIG. 18 is a block diagram of a π-type equivalent circuit.
Figure 19:
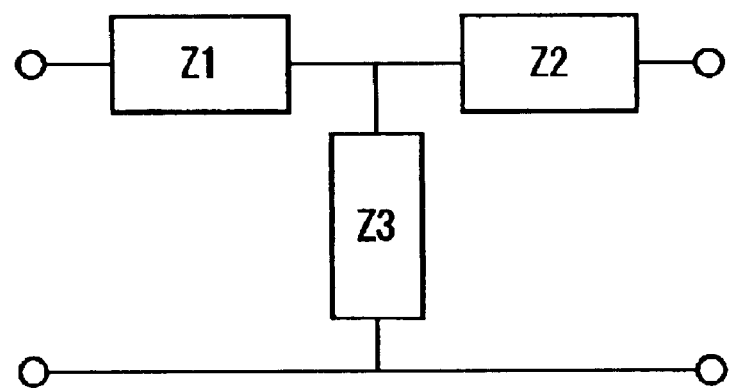
FIG. 19 is a block diagram of a T-type equivalent circuit.

The above description is given on the assumption that equivalent circuit 42 is a π-type circuit shown in FIG. 18. In the present invention, however, equivalent circuit 42 may alternatively be a T-type circuit shown in FIG. 19 or n series-connected T-type circuits 51 to 5n shown in FIG. 20 (where n is a natural number). Note that Z1 to Z3 in FIGS. 18 to 20 represent circuit elements such as R, C, L.

Figure 20:
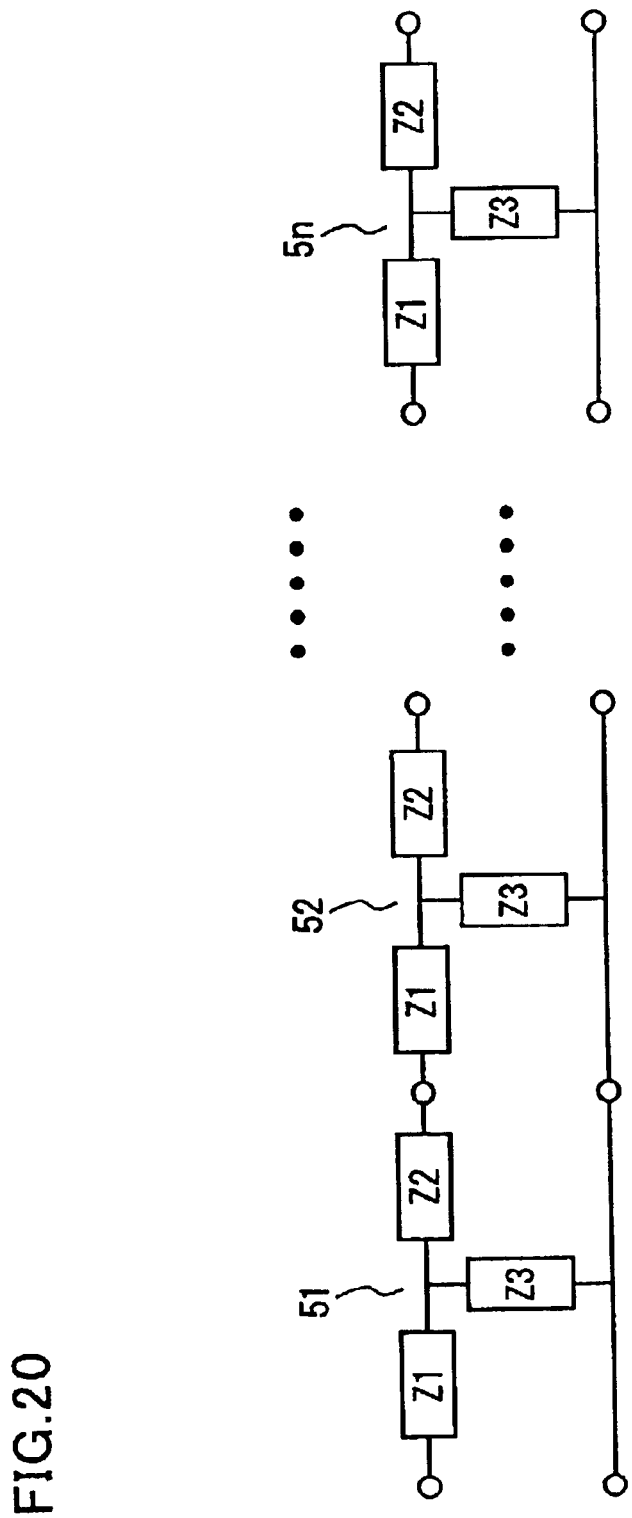
FIG. 20 shows n series-connected T-type equivalent circuits.

Another circuit may be added to the n T-type circuits shown in FIG. 20. The equivalent circuits may be connected in parallel. Alternatively, series connection and parallel connection may be combined.

As the number of circuit elements, that is, the number of unknowns, is increased, the number of measured values of impedance Z which is measured with the frequency of high-frequency power being varied must be increased. Provided that the equivalent circuit is formed by m circuit elements, impedance Z must be measured at m or more frequencies.

In the example described below, the impedance of an apparatus for etching a silicon oxide film was measured with the frequency of the high-frequency power being varied. The etching apparatus used herein is adapted for 8-inch wafer.

Figure 21:
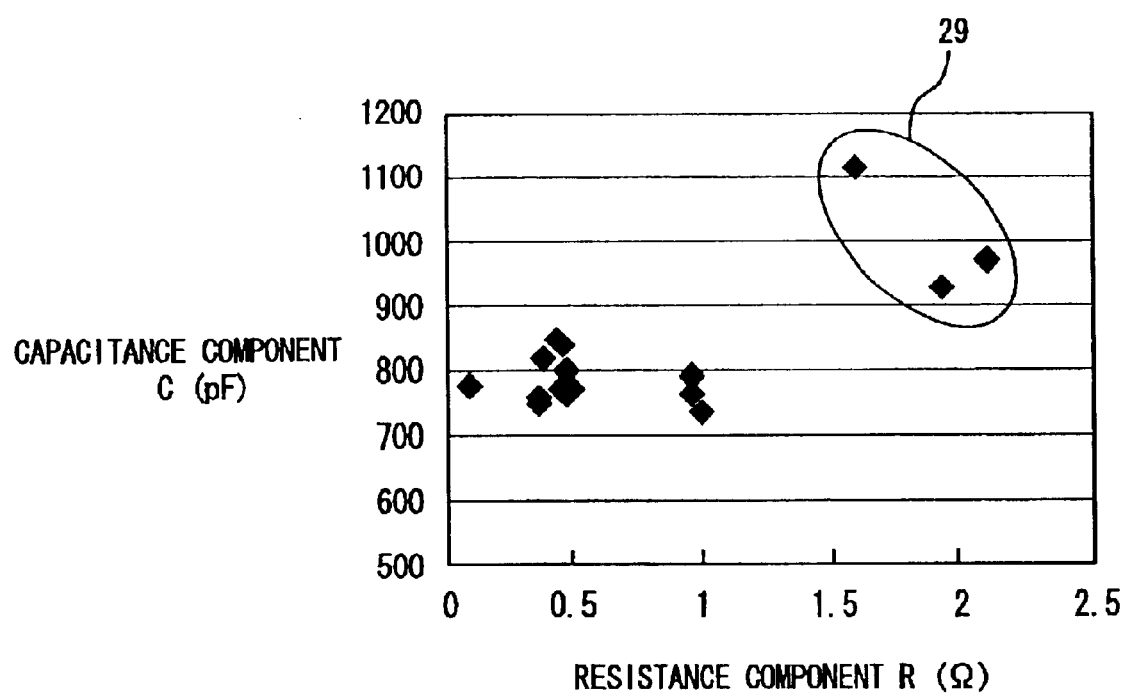
FIG. 21 shows a capacitance component and a resistance component of the impedance detected in the plasma processing apparatus of FIG. 14.

Seventeen parallel-plate etching apparatuses were used in this example. For each parallel-plate etching apparatus, impedance Z specific to the apparatus was measured with the frequency of the high-frequency power being varied, and resistance component R and capacitance component C were obtained by the above method based on the measured impedance Z. The result is shown in FIG. 21. The oscillation frequency of network analyzer 30 is in the range of 1 MHz to 50 MHz. Note that capacitance component C in FIG. 21 substantially represents capacitance C2 included in equivalent circuit 42 located under lower electrode 2 (see FIG. 16).

Figure 22:
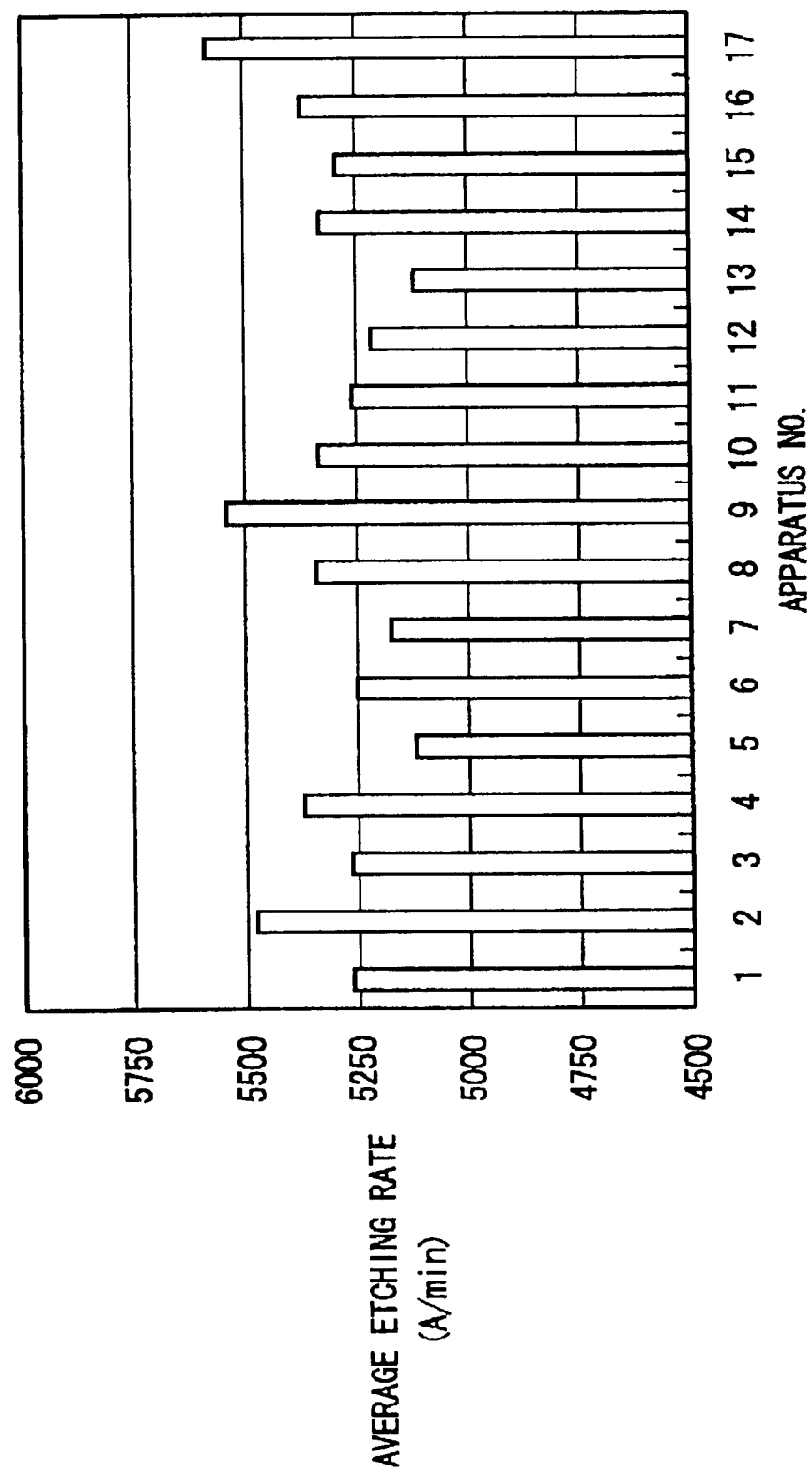
FIG. 22 shows the respective average etching rates of a plurality of plasma processing apparatuses.

FIG. 22 shows an average etching rate of each of the above seventeen etching apparatuses in one month.

In FIG. 21, the plasma processing apparatuses shown by reference numeral 29 have greater resistance component R and capacitance component C than the remaining plasma processing apparatuses. As shown in FIG. 22, these plasma processing apparatuses also have a greater average etching rate than the remaining plasma processing apparatuses.

It was found that the above differences were caused by the difference in distance of the high-frequency power feed line from connection 27 to lower electrode 2 between the plasma processing apparatuses, corrosion of the treated surface (insulating coating) in the portion of chamber 1 involved in opening and closing of the lid thereof, and the like.

As described above, capacitance component C in FIG. 21 represents capacitance component C2 included in equivalent circuit 42 located under lower electrode 2. Therefore, the above causes exactly match the difference between capacitance components obtained based on the impedances measured with the frequency of high-frequency power being varied.

It is now assumed that the impedance is measured with the frequency of the high-frequency power being varied, and the capacitance component obtained based on the measured impedance is different from that of another plasma processing apparatus or different from that corresponding to the normal process performance. In this case, the above difference is caused by the portion under lower electrode 2, that is, the path from connection 27 to lower electrode 2. Therefore, maintenance need only be conducted for that portion.

The fourth embodiment is otherwise the same as the second embodiment.

According to the fourth embodiment, the impedance specific to the apparatus is measured by supplying the high-frequency power in the range that does not cause generation of plasma to the lower electrode while varying the frequency thereof. The circuit constant of the equivalent circuit in each part of the plasma processing apparatus is then determined based on the measured impedance. As a result, the location causing a change in impedance specific to the plasma processing apparatus can be detected accurately in the plasma processing apparatus.

[Fifth Embodiment]

Figure 23:
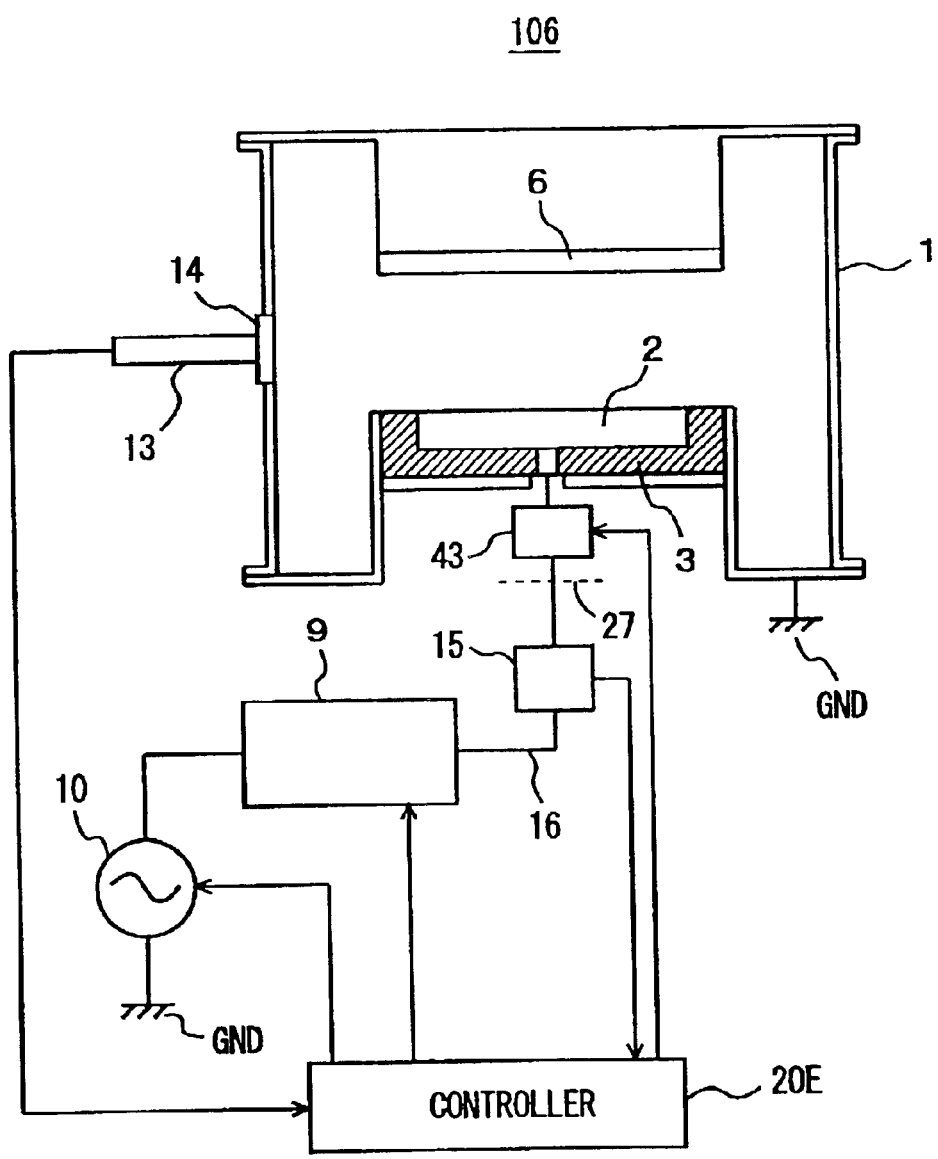
FIG. 23 is a schematic block diagram of a plasma processing apparatus according to a fifth embodiment of the present invention.

Referring to FIG. 23, a plasma processing apparatus 106 according to the fifth embodiment of the present invention is the same as plasma processing apparatus 101 except that controller 20 is replaced with a controller 20E and a correction circuit 43 is added.

Correction circuit 43 is connected between connection 27 and chamber 1. Correction circuit 43 corrects impedance Z specific to plasma processing apparatus 106 when impedance Z varies from the value corresponding to the normal process performance. For example, correction circuit 43 is formed by a variable capacitance C and a variable inductance L.

Controller 20E has the same functions as those of controller 20 in plasma processing apparatus 101. In addition, when it is determined that impedance Z obtained based on high-frequency current I and high-frequency voltage V received from monitor 15 are different from the normal impedance, controller 20E corrects variable capacitance C and variable inductance L of correction circuit 43 so that impedance Z becomes equal to the normal impedance.

Figure 24:
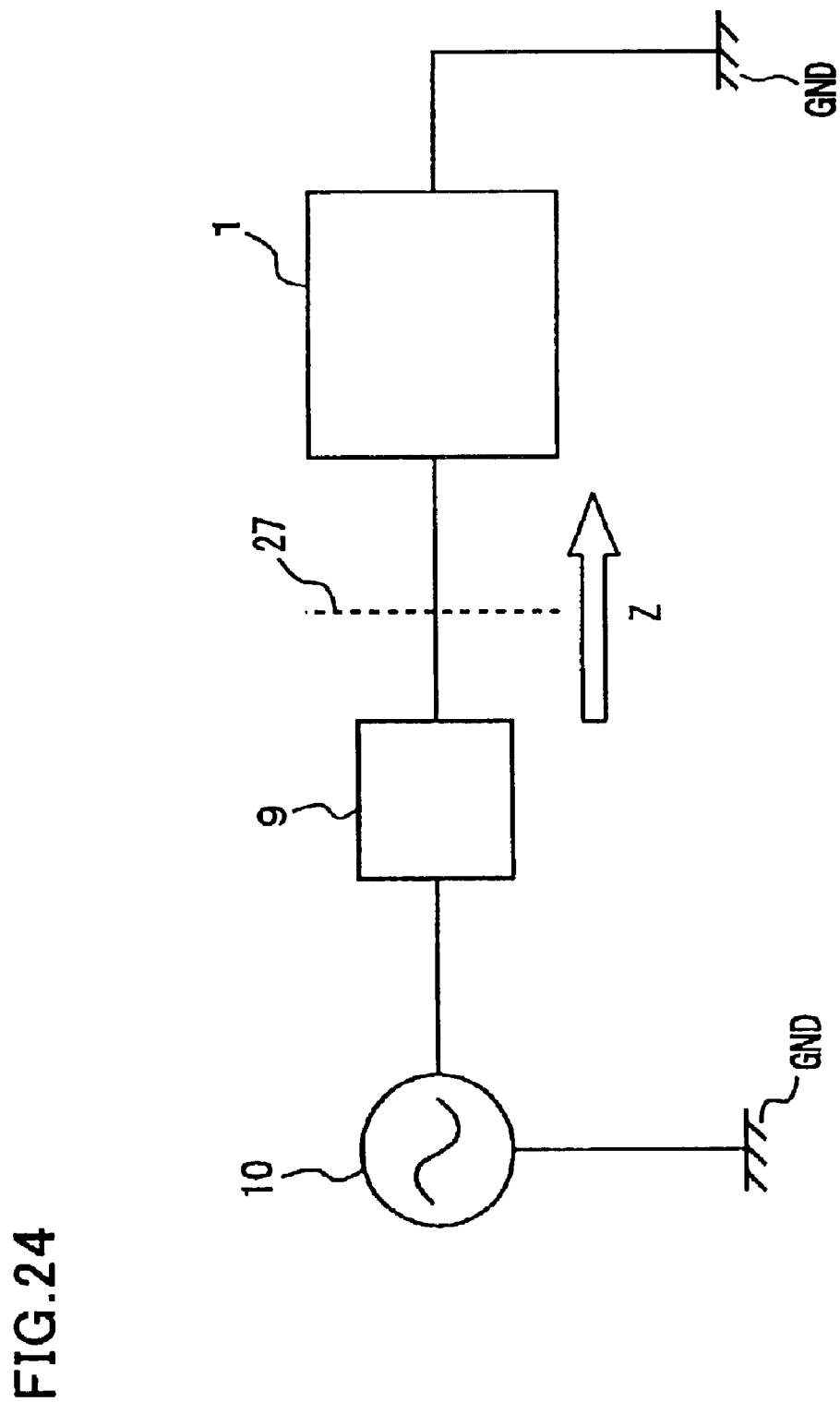
FIG. 24 is a first block diagram illustrating a method for correcting the impedance.
Figure 25:
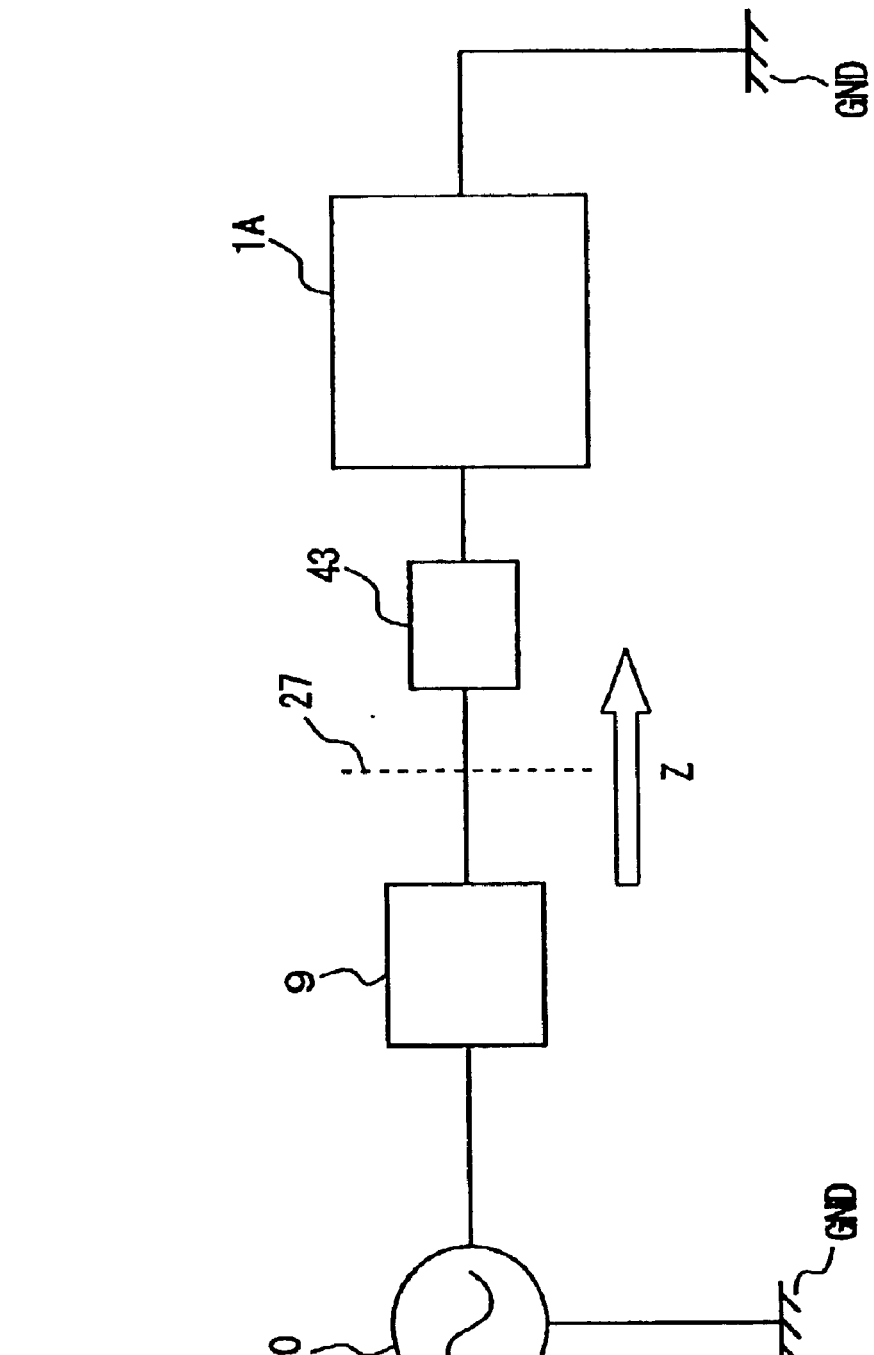
FIG. 25 is a second block diagram illustrating the method for correcting the impedance.

Hereinafter, a method for correcting the impedance will be described. Referring to FIGS. 24 and 25, high-frequency power supply source 10, high-frequency matching box 9 and chamber 1 are connected in series between two ground nodes GND, GND. In this system, high-frequency power supply source 10 supplies high-frequency power to chamber 1 through high-frequency matching box 9.

It is herein assumed that the original impedance Z of chamber 1 is an impedance of chamber 1 as viewed from connection 27 between high-frequency matching box 9 and chamber 1. When the impedance changes due to, aging of plasma processing apparatus 106 in the system of FIG. 24, correction circuit 43 is connected between chamber 1A having the changed impedance and connection 27, as shown in FIG. 25. The impedance of connection circuit 43 is then corrected so that the impedance of chamber 1A as viewed from connection 27 becomes equal to impedance Z.

Basically, correction circuit 43 may be provided at any position within the high-frequency power feed portion from high-frequency matching box 9 to chamber 1. However, correction circuit 43 is preferably provided at a position between connection 27 which is the point for measuring impedance Z specific to the plasma processing apparatus and chamber 1. This is because providing correction circuit 43 at a position between connection 27 and chamber 1 would reduce the measuring error of impedance Z, thereby facilitating detection of the difference between plasma processing apparatuses and aging of the plasma processing apparatus.

Figure 26:
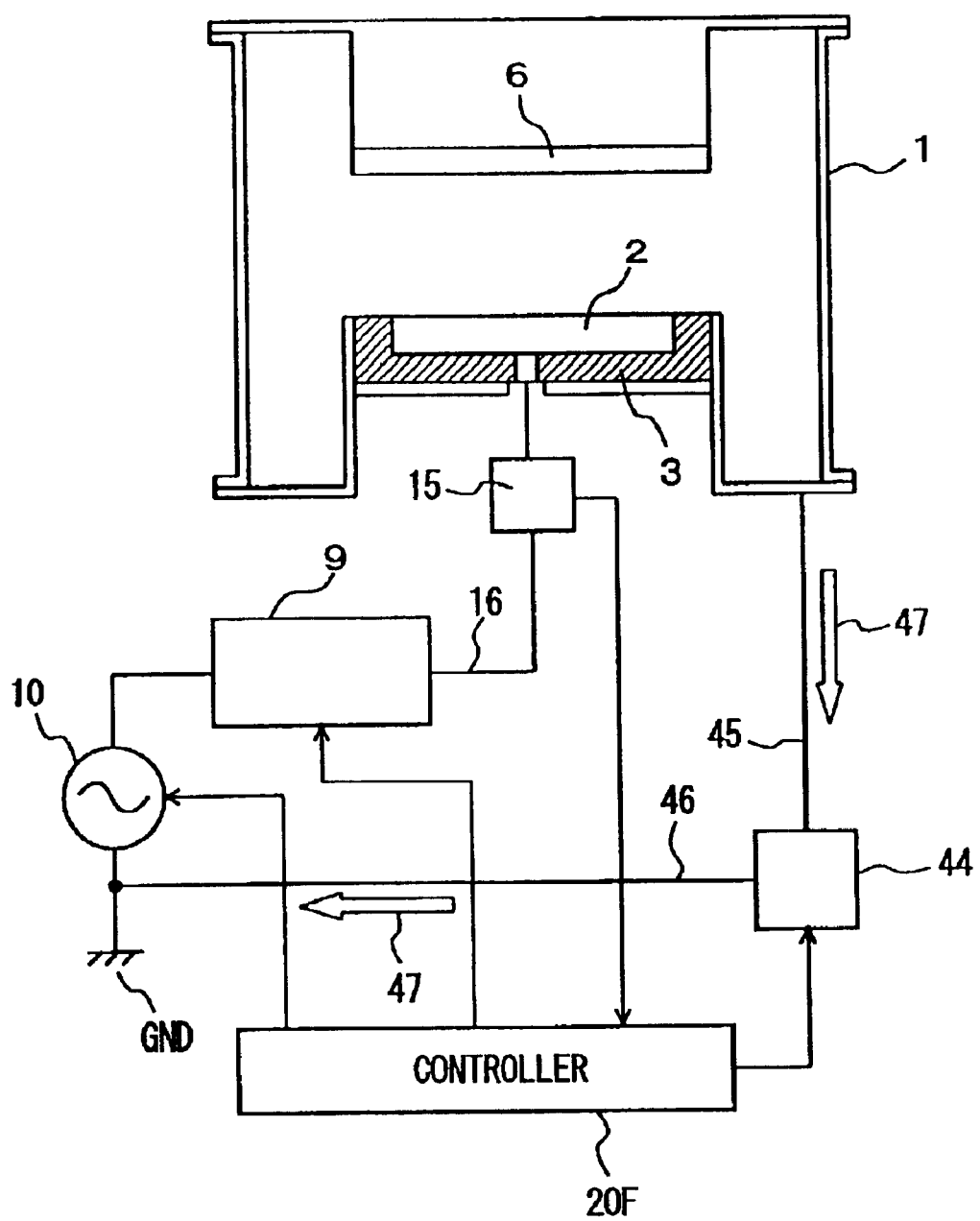
FIG. 26 is a schematic block diagram of another plasma processing apparatus according to the fifth embodiment.

A plasma processing apparatus 107 in FIG. 26 may be used in the fifth embodiment. Referring to FIG. 26, plasma processing apparatus 107 is the same as plasma processing apparatus 101 except that a correction circuit 44 is added, and controller 20 is replaced with a controller 20F.

Correction circuit 44 is connected between chamber 1 and ground node GND. Correction circuit 44 corrects impedance Z specific to plasma processing apparatus 107 when impedance Z varies from the value corresponding to the normal process performance. For example, correction circuit 44 is formed by a variable capacitance C and a variable inductance L. Note that, when correction circuit 44 is provided in the portion through which a return current 47 flows, the portion from chamber 1 to ground node GND of high-frequency power supply source 10 is preferably formed from copper plates 45, 46 having a large surface area rather than thin wires. This is because of reducing the influences of the surface resistance.

Controller 20F has the same functions as those of controller 20 in plasma processing apparatus 101. In addition, when it is determined that impedance Z obtained based on high-frequency current I and high-frequency voltage V received from monitor 15 are different from the normal impedance, controller 20F corrects variable capacitance C and variable inductance L of correction circuit 44 so that impedance Z becomes equal to the normal impedance.

The impedance correction method of plasma processing apparatus 107 is the same as that of plasma processing apparatus 106.

In plasma processing apparatus 106, correction circuit 43 for correcting the impedance is provided in the high-frequency power feed portion. In plasma processing apparatus 107, correction circuit 44 for correcting the impedance is provided in the portion through which return current 47 of the high-frequency power supplied from high-frequency power supply source 10 flows. Correction circuit 44 may be provided at any position within the portion through which return current 47 from chamber 1 to high-frequency power supply source 10 flows.

Correction circuit 44 may be provided between upper electrode 6 and chamber 1 or in a portion of chamber 1.

In the above description, the impedance correction method is conducted when the impedance of the plasma processing apparatus changes with time. However, the above impedance correction method may be applicable to the case where a plurality of plasma processing apparatuses have different impedances. In this case, the impedance of each plasma processing apparatus is corrected to a reference impedance.

Hereinafter, the impedance of which plasma processing apparatus is used as a correct impedance (reference impedance) will be described. When a new plasma processing apparatus is purchased, the impedance obtained in the witnessed test is commonly used as a correct impedance. The witness test is generally conducted when the new plasma processing apparatus is delivered to the factory. The impedance before shipment from the manufacturer may be used as a correct impedance. However, since the impedance may change during shipment due to the wear of a component or the like, the impedance upon delivery to the factory would better reflect the original performance of that plasma processing apparatus.

The original impedance Z of the plasma processing apparatus to be used as a reference impedance may become unknown in the following cases: a plurality of plasma processing apparatuses having the same structure are delivered but they have different impedances; the impedance obtained upon delivery becomes unknown for a plurality of plasma processing apparatuses already operating in the factory; when the structure of the plasma processing apparatuses is modified from the original structure; and the like.

In these cases, it is possible to conduct impedance correction in the plasma processing apparatus having a reference impedance. More specifically, the impedance specific to the plasma processing apparatus is corrected by correction circuit 43, 44 based on various parameters closely relating to the impedance specific to the apparatus.

A bias voltage Vdc induced upon generation of plasma in chamber 1 or a peak-to-peak voltage Vpp of a high-frequency voltage is detected in advance in the plasma processing apparatus having reference impedance Z. In the remaining plasma processing apparatuses, the impedance of correction circuit 43, 44 is corrected so that their bias voltage Vdc or peak-to-peak voltage Vpp become equal to those of the plasma processing apparatus having reference impedance Z. This prevents variation in performance between the plurality of plasma processing apparatuses caused by the difference between the apparatuses or aging of the apparatuses.

Note that the impedance correction method of the fifth embodiment is applicable to plasma processing apparatuses 102 to 105.

The fifth embodiment is otherwise the same as the second embodiment.

According to the fifth embodiment, the plasma processing apparatus includes a correction circuit correcting the impedance specific to the apparatus when the impedance varies from the original value. Therefore, the impedance can be easily corrected to the original value even when the impedance is changed by a change in dimensions of each part of the plasma processing apparatus, a change in the condition of each part of the plasma processing apparatus caused by wear, ablation or the like, the difference between the apparatuses caused by assembling accuracy, aging of the apparatus, and the like. Moreover, the impedance of the plurality of plasma processing apparatuses can be corrected to the original value.

[Sixth Embodiment]

In the first to fifth embodiments, the impedance specific to the plasma processing apparatus is detected, and the process performance of the plasma processing apparatus is evaluated based on the detected impedance. In the sixth embodiment, the detected impedance specific to the plasma processing apparatus is used for examination, maintenance and management of the plasma processing apparatus.

In order to detect a change in process performance of the plasma processing apparatus with time, it is necessary to periodically measure impedance Z.

As described in the fourth embodiment, seventeen parallel-plate etching apparatuses (plasma processing apparatuses) for etching a silicon oxide film were used for experimentation. These etching apparatuses are adapted for 8-inch wafer. In the experimentation, high-frequency power of the range that does not cause generation of plasma was supplied to lower electrode 2 and impedance Z was measured. According to the measurement result, three of the seventeen plasma processing apparatuses have a greater etching rate than the remaining plasma processing apparatuses. For these three plasma processing apparatuses, the cause of the greater etching rate was examined and measures were taken as necessary.

Maintenance of the seventeen plasma processing apparatuses such as cleaning of the inside of chamber 1, replacement of the parts, and the like was conducted every month. After every maintenance, impedance Z specific to the apparatus was measured by the method described in the third embodiment.

Figure 27:
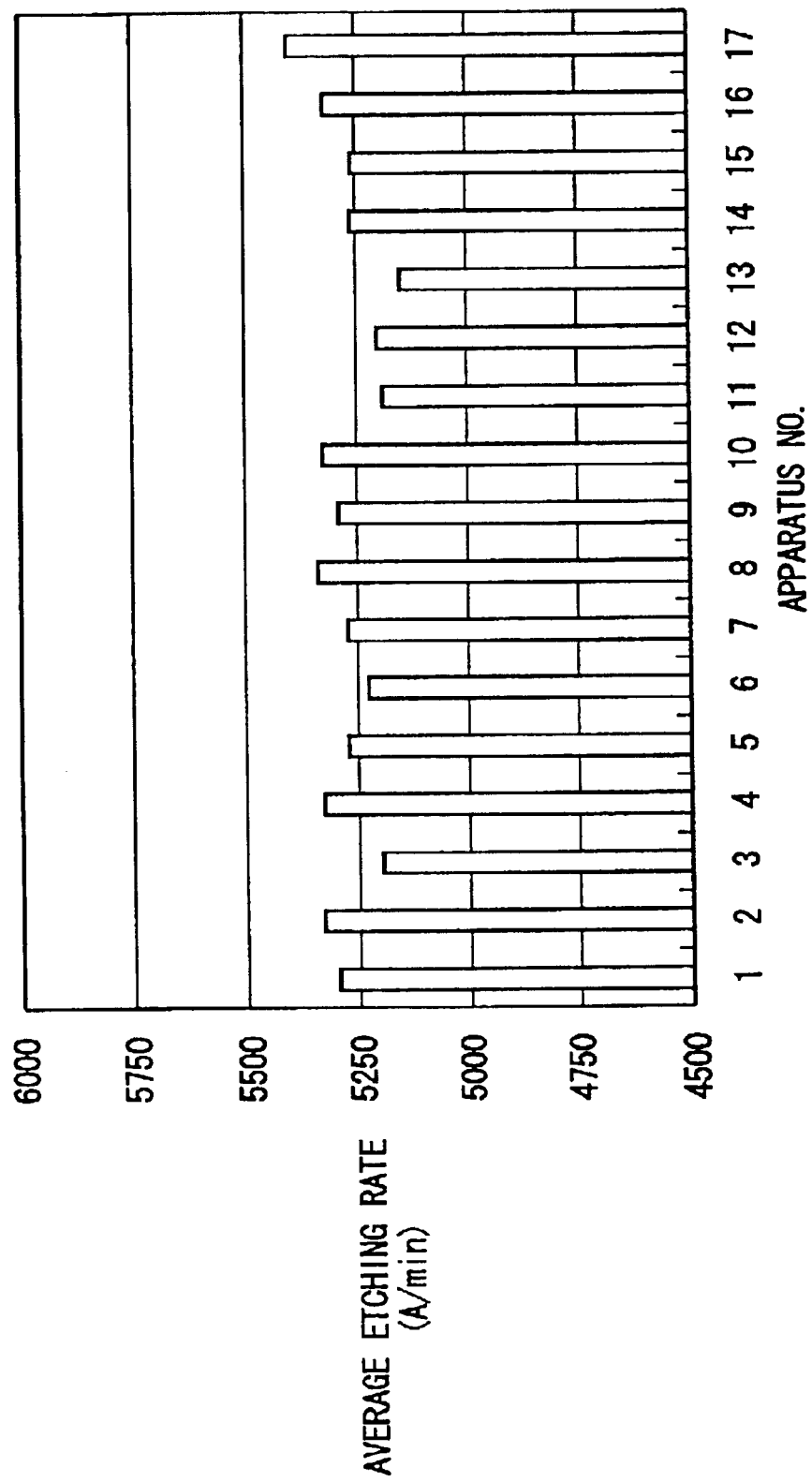
FIG. 27 shows the respective average etching rates of a plurality of plasma processing apparatuses.

FIG. 27 shows an average etching rate of each of the seventeen plasma processing apparatuses in one month. In this case, impedance Z was measured after every periodic maintenance. As compared to the example of FIG. 22, variation in etching rate was significantly reduced and the yield of chips was improved.

In the example of FIG. 27, the impedance specific to the apparatus is measured upon periodic maintenance. In other words, the impedance specific to the apparatus is measured with the plasma processing apparatus being stopped. However, impedance Z specific to the apparatus may be periodically measured without stopping plasma processing apparatus 101 to 107. In this case, impedance Z specific to the apparatus is measured by applying the impedance detected by monitor 15 or network analyzer 30 of the above plasma processing apparatus 101 to 107 to controller 20 to 20F.

It is possible to keep track of the impedance of plasma processing apparatus 101 to 107 on a real-time basis by monitoring a signal transmitted from monitor 15 or network analyzer 30 to controller 20 to 20F from the outside. In this case, an alarm (warning) is generated when a change in impedance Z of plasma processing apparatus 101 to 107 is detected. The abnormal state of plasma processing apparatus 101 to 107 can be detected in this way.

Figure 28:
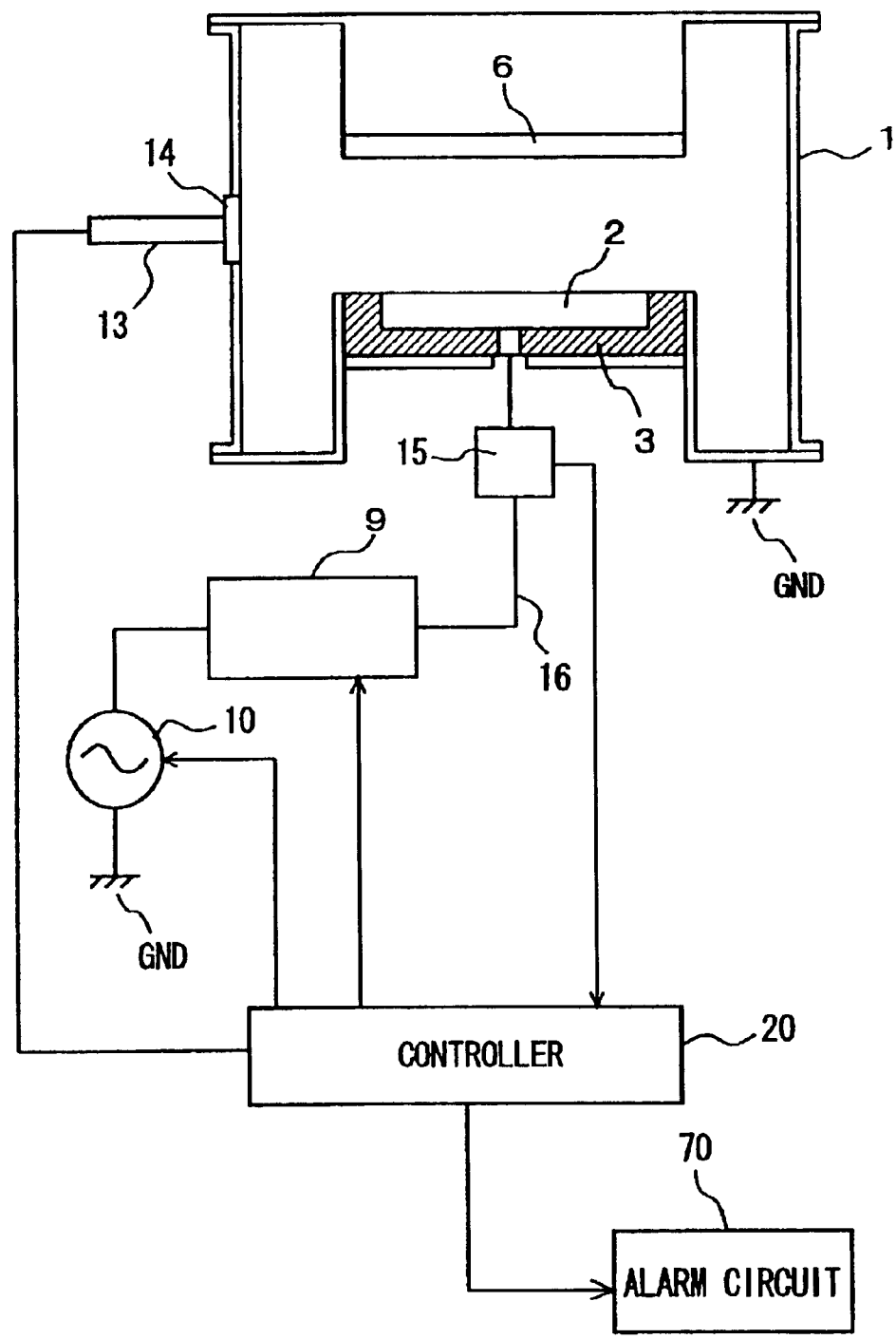
FIG. 28 is a schematic block diagram of a plasma processing apparatus according to a sixth embodiment of the present invention.
Figure 29:
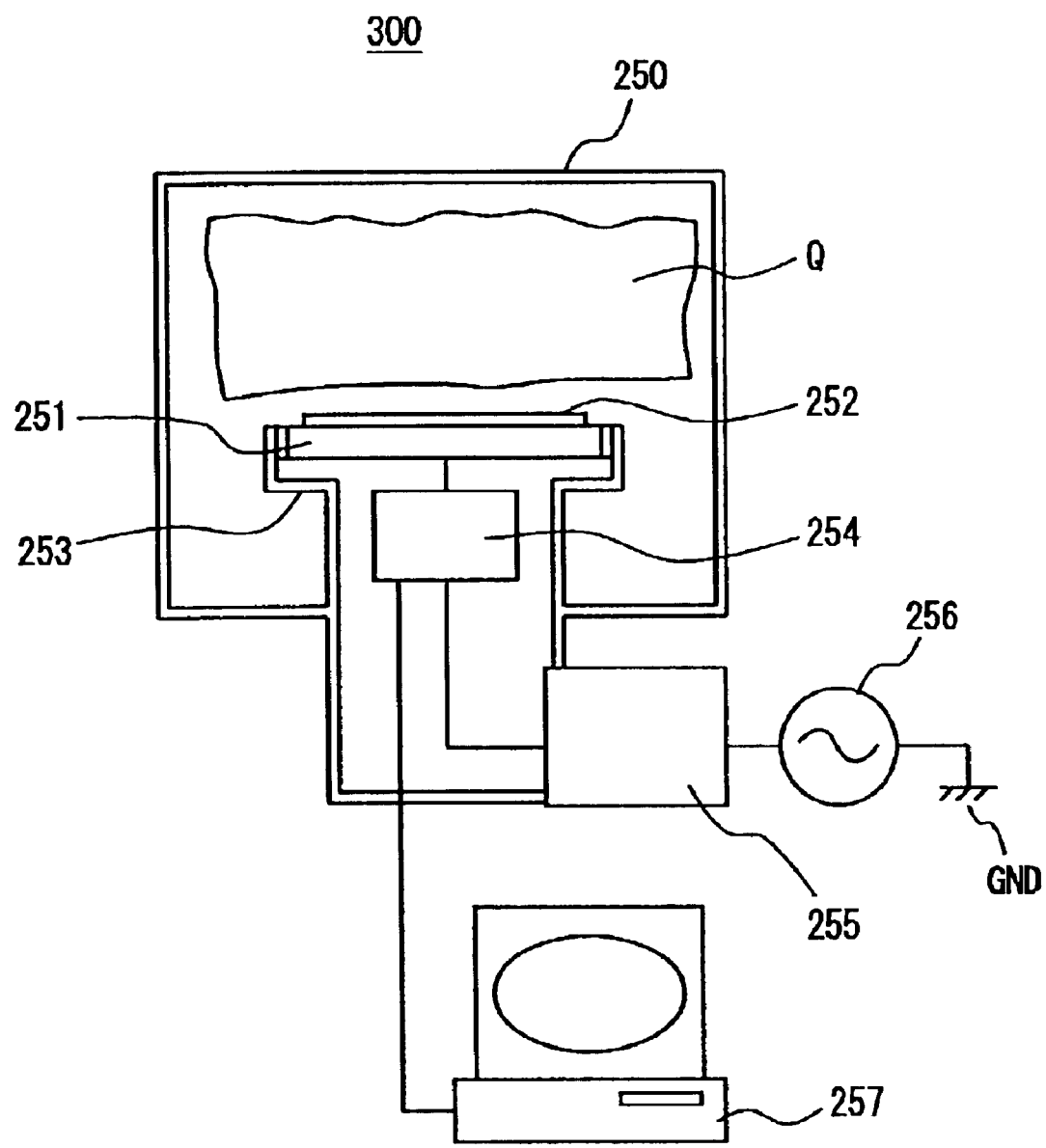
FIG. 29 is a schematic block diagram of a conventional plasma processing apparatus.
Figure 30:
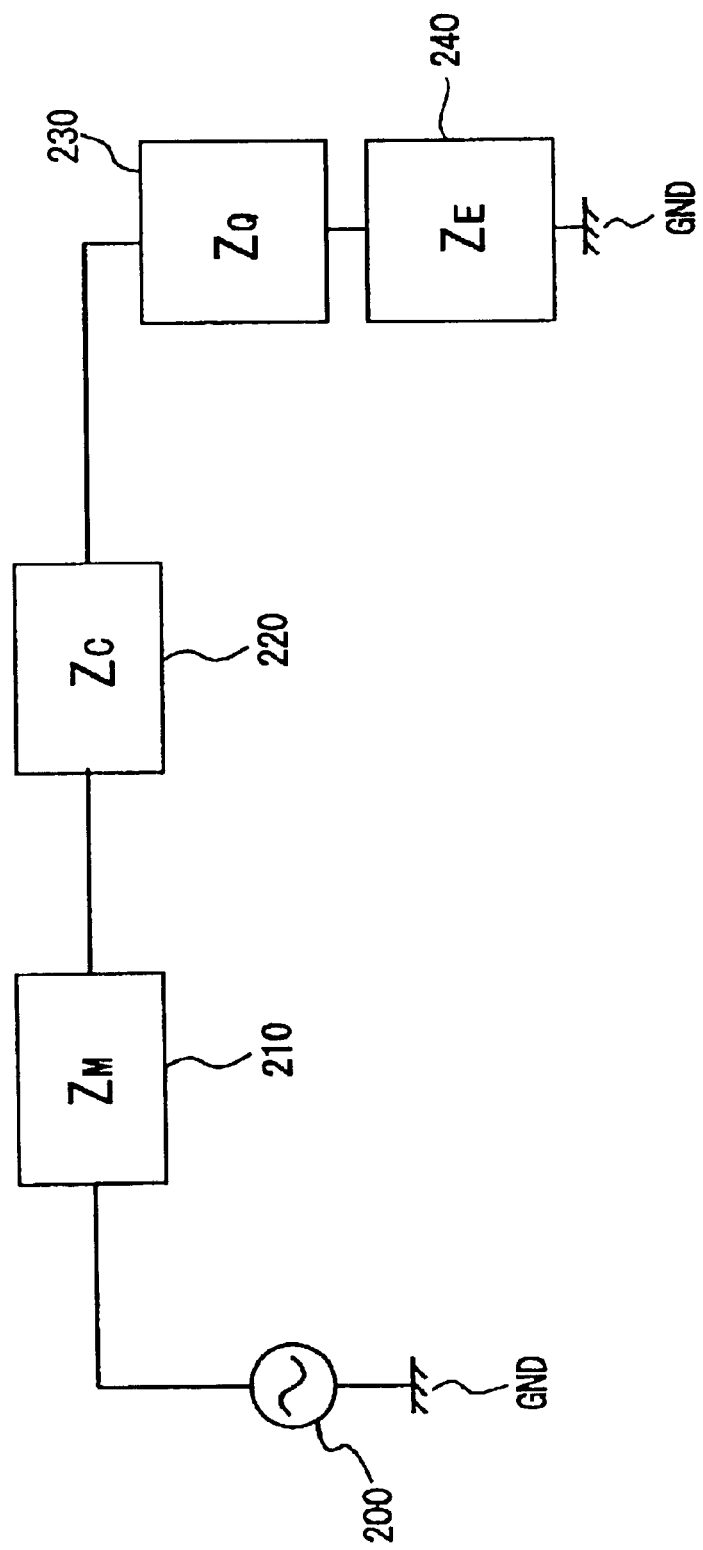
FIG. 30 shows an equivalent circuit of a conventional plasma processing apparatus.

FIG. 28 shows a plasma processing apparatus 108 as an example of the plasma processing apparatus having an alarm function. Referring to FIG. 28, plasma processing apparatus 108 is the same as plasma processing apparatus 101 except that an alarm circuit 70 is added.

Controller 20 obtains impedance Z by the above method, and alarm circuit 70 receives the obtained impedance Z from controller 20. Alarm circuit 70 generates an alarm (warning) when the received impedance Z varies from the impedance corresponding to the normal process performance by a prescribed amount. This facilitates detection of a change in process performance caused by the change in impedance specific to the apparatus.

The threshold value for generating the alarm varies depending on the structure of the plasma processing apparatus or the like. In the case of the plasma processing apparatus having network analyzer 30, 0.1% to 5% variation of a capacitance component from a preset reference value is defined as a threshold value for generating the alarm.

In the above description, the impedance is periodically measured in an individual plasma processing apparatus. However, the impedance may be periodically measured in a plurality of plasma processing apparatuses. If the measured impedances of the plurality of plasma processing apparatus are different from each other, the impedances are corrected using the correction method described in the fifth embodiment so that the impedances of the plurality of plasma processing apparatuses become equal to each other.

According to the sixth embodiment, the impedance specific to the apparatus is periodically measured. This facilitates detection of a change in impedance. Moreover, this facilitates detection of a change in impedance of a plurality of plasma processing apparatuses.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A plasma processing apparatus, comprising:
   a chamber for generating plasma;
   a high-frequency power supply source supplying high-frequency power to said chamber;
   another high-frequency power supply source supplying to said chamber high-frequency power in a range that is lower than that generating said plasma; and
   a characteristics evaluating circuit detecting high-frequency characteristics in said chamber by using said high-frequency power in a range lower than that generating said plasma, and evaluating process performance in said chamber based on the detected high-frequency characteristics, wherein
   said another high-frequency power supply source generates high-frequency power having a frequency varied in a prescribed range, and
   said characteristics evaluating circuit detects high-frequency characteristics obtained with the frequency of said high-frequency power being varied and evaluates said process performance based on the detected high-frequency characteristics.

2. The plasma processing apparatus according to claim 1, wherein
   said high-frequency characteristics are an impedance in said chamber, and
   said characteristics evaluating circuit detects a resonance frequency based on both frequency characteristics of the impedance obtained with the frequency of said high-frequency power being varied and frequency characteristics of a phase difference between a voltage and a current, and evaluates said process performance based on the detected resonance frequency.

3. The plasma processing apparatus according to claim 2, wherein said characteristics evaluating circuit obtains a circuit constant of an equivalent circuit based on said detected resonance frequency and resonance characteristics, and evaluates said process performance based on the obtained circuit constant.

4. The plasma processing apparatus according to claim 3, wherein said resonance characteristics include characteristics at a frequency higher than said resonance frequency and characteristics at a frequency lower that said resonance frequency.

5. The plasma processing apparatus according to claim 4, wherein said resonance characteristics include a phase difference between a high-frequency voltage and a high-frequency current, and an impedance.

6. The plasma processing apparatus according to claim 1, further comprising:
   a cable connecting said another high-frequency power supply source to said chamber, wherein
   said characteristics evaluating circuit detects said high-frequency characteristics at a connection point between said cable and said chamber.

7. The plasma processing apparatus according to claim 6, wherein
   said high-frequency characteristics are and impedance, and
   said characteristics evaluating circuit removes an impedance of said cable detected in advance from said detected impedance, and evaluates said process performance based on the resultant impedance.

* * * * *